(12) United States Patent
Takamine

(10) Patent No.: US 6,762,657 B2
(45) Date of Patent: *Jul. 13, 2004

(54) LONGITUDINALLY COUPLED RESONATOR-TYPE SURFACE ACOUSTIC WAVE FILTER

(75) Inventor: Yuichi Takamine, Kanazawa (JP)

(73) Assignee: Murata Manufacturing Co., Ltd., Kyoto (JP)

(*) Notice: Subject to any disclaimer, the term of this patent is extended or adjusted under 35 U.S.C. 154(b) by 64 days.

This patent is subject to a terminal disclaimer.

(21) Appl. No.: 09/833,538

(22) Filed: Apr. 12, 2001

(65) Prior Publication Data

US 2002/0017969 A1 Feb. 14, 2002

(30) Foreign Application Priority Data

Apr. 18, 2000 (JP) .................................... 2000-116815
Jan. 29, 2001 (JP) .................................... 2001-020456

(51) Int. Cl.[7] .............................. H03H 9/64; H03H 9/72
(52) U.S. Cl. ........................ 333/193; 333/195; 333/133; 310/313 B
(58) Field of Search ................................ 333/193–196, 333/133; 310/313 R, 313 B, 313 C, 313 D

(56) References Cited

U.S. PATENT DOCUMENTS

| | | | | |
|---|---|---|---|---|
| 5,521,453 A | * | 5/1996 | Yatsuda ................... | 310/313 R |
| 5,568,002 A | * | 10/1996 | Kawakatsu et al. ...... | 310/313 B |
| 6,037,847 A | * | 3/2000 | Ueda et al. .................. | 333/193 |
| 6,329,888 B1 | * | 12/2001 | Hirota .......................... | 333/193 |
| 6,335,667 B1 | * | 1/2002 | Takagi et al. ............... | 333/195 |
| 6,380,827 B1 | * | 4/2002 | Noguchi ..................... | 333/193 |
| 6,420,946 B1 | * | 7/2002 | Bauer et al. ................. | 333/193 |

FOREIGN PATENT DOCUMENTS

| | | |
|---|---|---|
| DE | 42 12 517 C2 | 10/1993 |
| EP | 1 175 006 | 1/2002 |
| JP | 64-019815 | 1/1989 |
| JP | 2-150107 | 6/1990 |
| JP | 4-040705 | 2/1992 |
| JP | 5-267990 | 10/1993 |
| JP | 5-335881 | 12/1993 |
| JP | 6-204781 | 7/1994 |
| JP | 7-030366 | 1/1995 |
| JP | 7-307641 | 11/1995 |
| JP | 9-148873 | 6/1997 |
| JP | 9-238047 | 9/1997 |
| JP | 9-321567 | 12/1997 |
| JP | 9-326661 | 12/1997 |
| JP | 10-93384 | 4/1998 |
| JP | 10-093388 | 4/1998 |
| JP | 11-317642 | 11/1999 |
| JP | 11-346141 | 12/1999 |
| JP | 2000-49558 | 2/2000 |
| JP | 2000-183682 | 6/2000 |
| JP | 2001-217680 | 8/2001 |
| JP | 2002-84164 | 3/2002 |
| JP | 2002-528987 | 9/2002 |
| WO | WO 00/25423 | * 5/2000 |

OTHER PUBLICATIONS

Ronald C. Rosenfeld et al.:"Analysis of Asymetric Three–Transducer Configuration"; 1976 Ultrasonics Symposium Proceedings; pp. 682–685.

* cited by examiner

Primary Examiner—Barbara Summons
(74) Attorney, Agent, or Firm—Keating & Bennett, LLP

(57) ABSTRACT

A longitudinally coupled resonator-type surface acoustic wave filter includes a piezoelectric substrate and at least three IDTs provided on the piezoelectric substrate along the propagation direction of the surface acoustic wave and each having a plurality of electrode fingers. In at least one of the IDTs, the electrode finger period of a first portion that is adjacent to the side edge of another IDT in the propagation direction of the surface acoustic wave is different from the electrode finger period of a second portion that is the remaining part of the IDT.

21 Claims, 30 Drawing Sheets

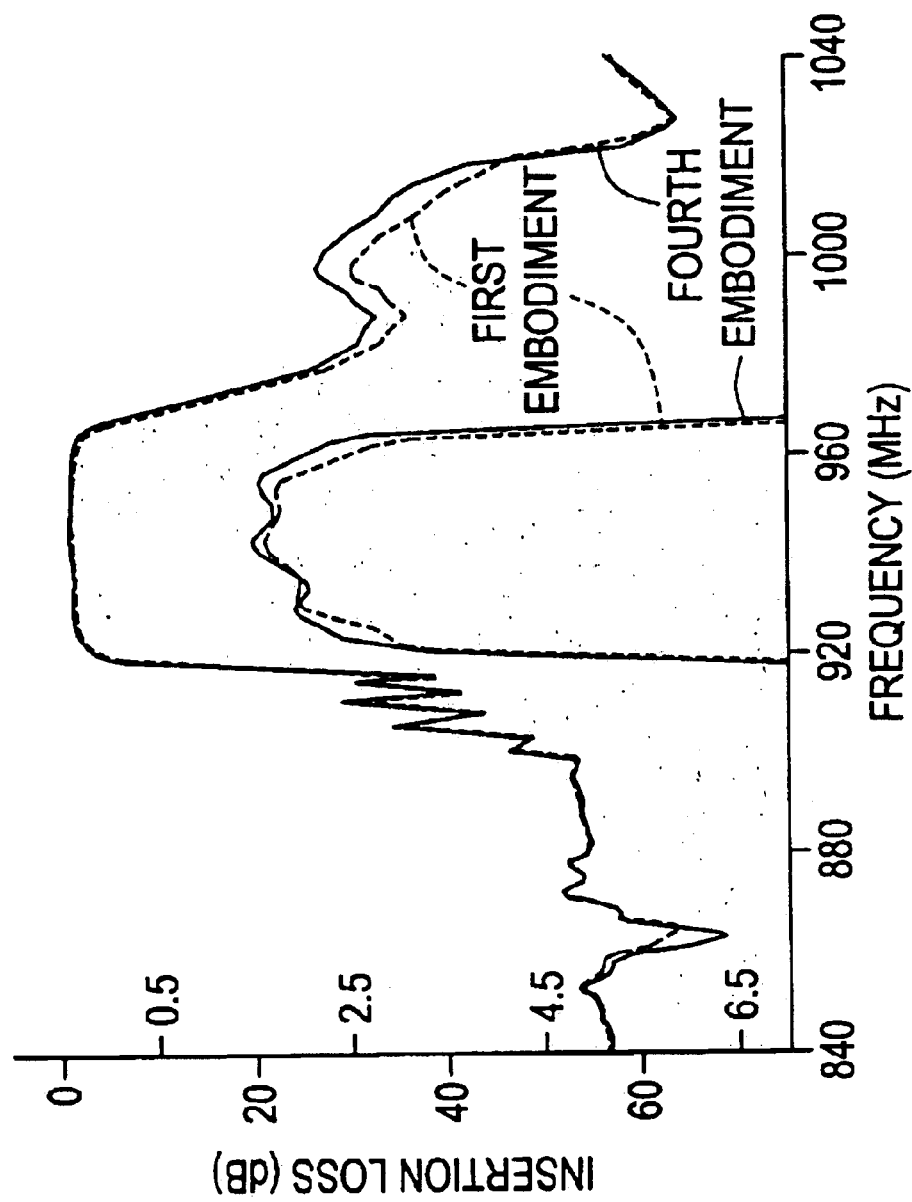

LONGITUDINALLY COUPLED RESONATOR-TYPE SURFACE ACOUSTIC WAVE FILTER

BACKGROUND OF THE INVENTION

1. Field of the Invention

The present invention relates to longitudinally coupled resonator-type surface acoustic wave filters, and more particularly, relates to a longitudinally coupled resonator-type surface acoustic wave filter having three or more interdigital transducers ("IDTs").

2. Description of the Related Art

Conventionally, surface acoustic wave filters have been widely used as an RF stage band-pass filter of a mobile phone. Low insertion loss, large attenuation, wideband, and other such characteristics are required for the band-pass filter. To satisfy these requirements, various propositions have been made for the surface acoustic wave filter.

In Japanese Unexamined Patent Application Publication No. 5-267990, one example of a method for achieving a wider band of a longitudinally coupled resonator-type surface acoustic wave filter is disclosed. In this publication, electrode fingers are arranged to periodically line up between IDTs that are adjacent to each other, and a process for optimally providing a resonant mode by causing the center distance between the adjacent electrode fingers of two IDTs that are adjacent to each other in the propagation direction of a surface acoustic wave to be deviated by about 0.5 times of the wavelength determined by the period of the electrode fingers is disclosed.

However, when, as described above, the center distances between adjacent electrode fingers of IDTS that are adjacent to each other is deviated by about 0.5 times of the wavelength determined by the period of the electrode fingers, the periodical continuity of the surface acoustic wave propagation path is worsened in the corresponding part. Particularly, when a piezoelectric substrate, such as a 36° Y-cut X-propagating $LiTaO_3$ or a 64° Y-cut X-propagating $LiNbO_3$, making use of a leaky surface acoustic wave (leaky wave) is used, loss due to bulk wave radiation increases. As a result, although realization of a wider band can be intended, there is a problem in that insertion loss increases.

SUMMARY OF THE INVENTION

In order to overcome the problems described above, preferred embodiments of the present invention provide a longitudinally coupled resonator-type surface acoustic wave filter which solves the foregoing problems, so that not only the realization of the wider band but also significant reduction in the insertion loss in a passband can be achieved.

In a longitudinally coupled resonator-type surface acoustic wave filter according to a preferred embodiment of the present invention, since at least one IDT among at least three IDTs is constructed so that the electrode finger period of a first portion that is adjacent to the side edge of another IDT in the propagation direction of the surface acoustic wave is different from the electrode finger period of a second portion that is the remaining portion of the IDT, it is possible to not only achieve the expansion of the passband width but also greatly reduce the insertion loss in the passband.

Therefore, the longitudinally coupled resonator-type surface acoustic wave filter having a wider band and low loss in the passband is achieved.

When the electrode finger period of the first portion is shorter than the electrode finger period of the second portion, the propagation loss of the surface wave is greatly reduced. This enables the insertion loss in the passband to be even more reduced.

Particularly, when the electrode finger period of the first portion is approximately 0.82 to about 0.99 times the electrode finger period of the second portion, the propagation loss of the surface wave can be even more reduced.

When the center distance between adjacent electrode fingers of a pair of adjacent IDTs is caused to be substantially equal to $0.5\lambda I1$, the loss radiated as a bulk wave is greatly reduced, which reduces the insertion loss even more.

When only one of a pair of the IDTs which are adjacent to each other is constructed so as to include the first portion and the second portion and when the center distance between adjacent electrode fingers of the pair of adjacent IDTs is caused to be substantially equal to $0.25\lambda I1 + 0.25\lambda I2$, the loss radiated as the bulk wave is greatly reduced in the same manner, which reduces the insertion loss in the passband by an even larger amount.

When the electrode finger distance is substantially equal to $0.25\ \lambda I1 + 0.25\ \lambda I2$ in a portion in which electrode fingers of the first portion and electrode fingers of the second portion are adjacent to each other, the loss radiated as the bulk wave can be reduced in the same manner, which more reduces the insertion loss in the passband.

When the polarity of the electrode fingers adjacent to each other of the IDT including the first portion and the second portion and the polarity of the electrode fingers of the IDT adjacent to the IDT are different, the surface acoustic wave is converted into an electric signal in the spacing between adjacent IDTs as well. This increases the conversion efficiency into the electric signal and improves the insertion loss in the passband even more. In addition, the passband width is expanded.

When the total number of electrode fingers of the first portions is not more than 18 on both sides of the adjacent portions of a pair of the IDTs which are adjacent to each other, the concentration ratio of the impedance is increased whereby the longitudinally coupled resonator-type surface acoustic wave filter having small VSWR can be provided.

When the center distance between the electrode fingers, having periods that are not different, of a pair of the IDTs which are adjacent to each other is $(0.08+0.5n)\lambda I2$ to $(0.24+0.5n)\lambda I2$, more preferably, $(0.13+0.5n)\lambda I2$ to $(0.23+0.5n)\lambda I2$, a necessary bandwidth can be obtained in accordance with various applications such as an EGSM method, a DCS method, and a PCS method, and VSWR can be positively reduced.

When both of a pair of the IDTs, which are adjacent to each other in the propagation direction of the surface acoustic wave filter, include the first portion and the second portion, and the numbers of electrode fingers of the first portions of both IDTs are different, though the concentration ratio of the impedance as well as VSWR are worsened, the expansion of the passband width can be achieved even more readily.

When what is obtained by rotating a $LiTaO_3$ single crystal in the direction of the Y axis in the range of approximately 36° to 44° with respect to the X axis is used as the piezoelectric substrate, the longitudinally coupled resonator-type surface acoustic wave filter having a wide passband width and low insertion loss in the passband can be easily obtained according to various preferred embodiments of the present invention.

When the film thickness of the electrode fingers of the first portion is different from the film thickness of the electrode fingers of the second portion, the loss due to the radiation of the bulk wave is greatly reduced by adjusting the electrode film thickness. Particularly, when the film thickness of the electrode fingers of the first portion is caused to be thinner than the film thickness of the electrode fingers of the second portion, since the loss due to the radiation of the bulk wave can be reduced in the spacing between IDTs in which the bulk wave is most likely to be generated, the insertion loss can be even more reduced while the wide bandwidth is maintained.

When, in a construction in which multiple-stage longitudinally coupled resonator-type surface acoustic wave filters are cascaded, the electrode finger period of the first portion of at least one stage of the longitudinally coupled resonator-type surface acoustic wave filter is caused to be different from the electrode finger period of the first portion of another stage thereof, the passband width can be expanded even more without causing the deterioration in VSWR.

When the electrode finger period of the first portion is different in each stage of the multiple-stage longitudinally coupled resonator-type surface acoustic wave filter, the passband width can be effectively expanded.

When at least one series resonator and/or parallel resonator is connected to an input side and/or output side, not only the reduction in the insertion loss in the passband but also the expansion of the out-of-passband attenuation amount can be achieved according to various preferred embodiments of the present invention.

The longitudinally coupled resonator-type surface acoustic wave filter according to various preferred embodiments of the present invention may be constructed so as to have a balanced-unbalanced input/output or a balanced-balanced input/output.

That is, various input/output types of longitudinally coupled resonator-type surface acoustic wave filters can be easily provided in accordance with various applications.

Since a communication apparatus according to a preferred embodiment of the present invention is provided with the longitudinally coupled resonator-type surface acoustic wave filter constructed according to various preferred embodiments of the present invention as a band-pass filter, the communication apparatus having a wider bandwidth and the low loss can be constructed.

For the purpose of illustrating the invention, there is shown in the drawings several forms which are presently preferred, it being understood, however, that the invention is not limited to the precise arrangements and instrumentalities shown.

Other elements, characteristics, features and advantages of the present invention will become more apparent from the following detailed description of preferred embodiments of the present invention with reference to the attached drawings.

BRIEF DESCRIPTION OF THE DRAWINGS

FIG. 19 is a graph indicating the amplitude characteristics of the longitudinally coupled resonator-type surface acoustic wave filters according to the fourth and first preferred embodiments.

DETAILED DESCRIPTION OF PREFERRED EMBODIMENTS

Hereinafter, preferred embodiments of the present invention are explained in detail with reference to the drawings.

The present invention is described in more detail by illustrating actual preferred embodiments according to the present invention.

Figure 1:
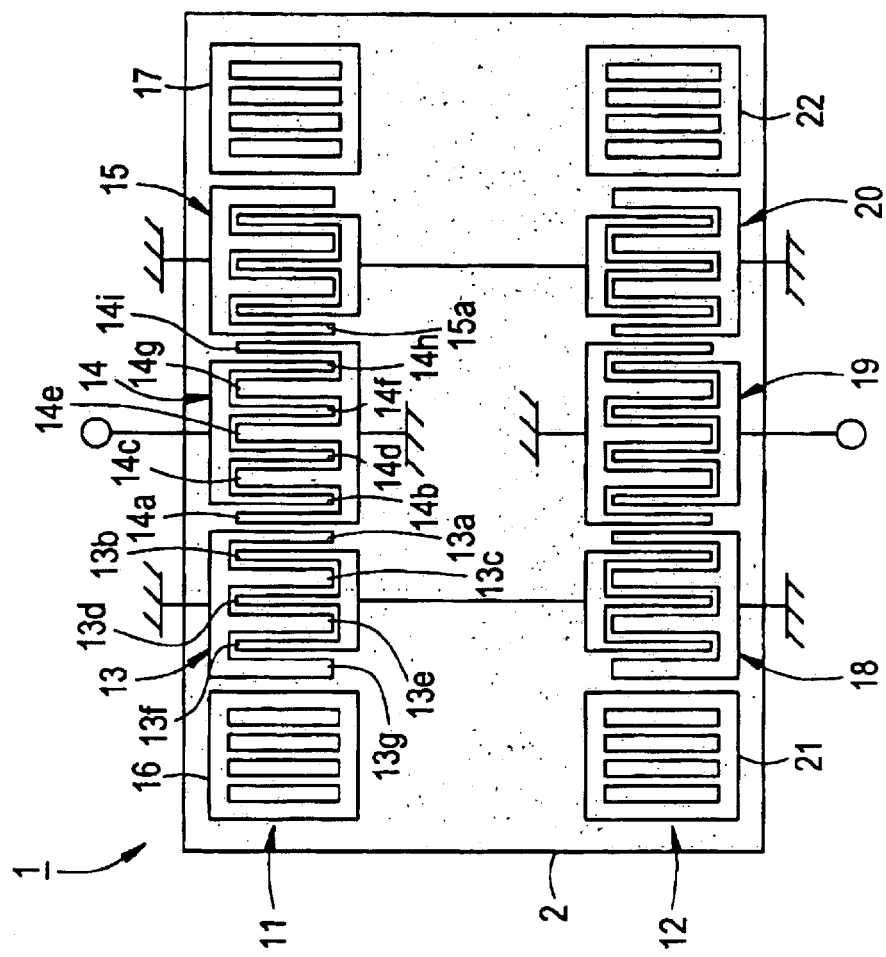
FIG. 1 is a schematic plan view of a longitudinally coupled resonator-type surface acoustic wave filter according to a first preferred embodiment of the present invention.

FIG. 1 is a schematic plan view illustrating a longitudinally coupled resonator-type surface acoustic wave filter according to a first preferred embodiment of the present invention. The present preferred embodiment and subsequent preferred embodiments are applied to a receiving band-pass filter of an EGSM type mobile phone. The longitudinally coupled resonator-type surface acoustic wave filter according to various preferred embodiments of the present invention can be used as a band-pass filter in another type of mobile phone and another communication apparatus except the mobile phone.

A longitudinally coupled resonator-type surface acoustic wave filter 1 according to various preferred embodiments of the present invention is preferably constructed by forming an electrode construction, indicated using the schematic plan view in FIG. 1, on a piezoelectric substrate 2. The piezoelectric substrate 2 is constructed using a 36° Y-cut X-propagating $LiTaO_3$ substrate. The piezoelectric substrate 2 may be constructed using a $LiTaO_3$ substrate having another crystal orientation. Alternatively, it may be constructed using another piezoelectric material other than the $LiTaO_3$ substrate, for example, a piezoelectric single crystal, such as a $LiNbO_3$ substrate or a quartz crystal, or a piezoelectric ceramic or other suitable material. Furthermore, the piezoelectric substrate 2 may be constructed by forming a piezoelectric thin film such as a ZnO thin film on an insulated substrate.

In the longitudinally coupled resonator-type surface acoustic wave filter 1 according to the present preferred embodiment, the electrode construction, which is fully described below, is formed on the piezoelectric substrate 2 preferably using Al. A metal other than Al or an alloy may be used as the electrode material.

In the present preferred embodiment, first and second longitudinally coupled resonator-type surface acoustic wave filters 11 and 12 are vertically connected. That is, the two longitudinally coupled resonator-type surface acoustic wave filters 11 and 12 establish the two-stage vertical connection.

The surface acoustic wave filters 11 and 12 each preferably have three IDTs provided along the propagation direction of the surface acoustic wave. That is, these surface acoustic wave filters 11 and 12 are three IDT-type longitudinally coupled resonator-type surface acoustic wave filters. The electrode designs of the surface acoustic wave filters 11 and 12 preferably are substantially the same.

The surface acoustic wave filter 11 has IDTs 13 to 15. Grating-type reflectors 16 and 17 are provided at both ends of a portion having the IDTs 13 to 15 formed thereon in the propagation direction of the surface wave. Likewise, the surface acoustic wave filter 12 has three IDTs 18 to 20 and grating-type reflectors 21 and 22 at both ends of a region having the IDTs 18 to 20 formed thereon to extend in the propagation direction of the surface wave.

In the present preferred embodiment, one end of the IDT 14 provided in the middle of the surface acoustic wave filter 11 is an input terminal, and the IDT 19 provided in the middle of the surface acoustic wave filter 12 is an output terminal. Ends of the IDTs 13 and 15 are connected to the corresponding ends of the IDTS 18 and 20. As is obvious from FIG. 1, the other ends of IDTs 13 to 15 and IDTs 18 to 20, which are opposite to the corresponding ends connected to the input/output terminals or interconnected to other IDTs, are each connected to the ground potential.

The longitudinally coupled resonator-type surface acoustic wave filters 1 according to the present preferred embodiment is characterized in that, in the surface acoustic wave filters 11 and 12, the electrode finger pitch of a portion of the IDTs is narrower than the electrode finger pitch of the remaining portion of the IDTs on both sides of the IDTs that are adjacent to each other. This is described in more detail using the spacing between IDT 13 and IDT 14 as an example.

The IDTs 13 and 14 are adjacent to each other in the propagation direction of the surface wave. The electrode finger pitch between the electrode fingers 13a and 13b, which are several electrode fingers from the edge part of the IDT 13 on the IDT 14 side, is narrower than the electrode finger pitches among the remaining electrode fingers 13c, 13d, 13e, 13f, and 13g. Likewise, in the IDT 14, the electrode finger pitch between the electrode fingers 14a and 14b, which are several electrode fingers from the edge portion of the IDT 14 on the IDT 13 side, is narrower than the electrode finger pitches among 14c, 14d, 14e, 14f, and 14g. In the IDT 13, the portion in which the electrode finger pitch between the electrode fingers 13a and 13b, which are multiple electrode fingers from the side edge portion of the IDT 14, as described above, is narrowed is a first portion and the portion in which the remaining portion provided with the electrode fingers 13c to 13g is a second portion. In this manner, in the surface acoustic wave filter 1 according to the present preferred embodiment, each IDT causes a plurality of electrode fingers thereof from the side edge of its adjacent IDT to be narrower electrode finger pitch than the electrode finger pitch of the remaining thereof.

In the IDT 14 provided in the middle, the first portions are provided at both sides in the propagation direction of the surface wave. That is, not only in the portion in which the above described electrode fingers 14a and 14b are provided but also in a portion in which the multiple electrode fingers 14h and 14i are provided at the edge portion of the IDT 14 on the IDT 15 side the electrode finger pitch is narrowed. Accordingly, the portion in which the electrode fingers 14h and 14i are provided is also the first portion.

In the IDT 15, the first portion is constructed on the IDT 14 side preferably in the same manner as in the IDT 13, and the remaining portion, other than the first portion, constitutes the second portion. The IDTs 18 to 20 of the surface acoustic wave filter 12 are constructed preferably in a similar manner to the IDTs 13 to 15.

In FIG. 1 and other figures each representing the electrode constructions of subsequent modification examples and other preferred embodiments, in order to simplify illustrations, the electrode fingers are shown so that the number thereof is smaller than the actual number thereof.

Next, details of the electrode construction of the surface acoustic wave filter 1 according to the present preferred embodiment are described more specifically.

The wavelength of the surface wave determined by the electrode finger pitch of the first portion is $\lambda I1$ and the wavelength of the surface wave determined by the electrode finger pitch of the second portion is $\lambda I2$.

The intersecting width of each of the electrode fingers IDTs 13 to 18 is preferably approximately $35.8\lambda I2$, and the electrode film thickness is preferably approximately $0.08\lambda I2$.

The numbers of electrode fingers of the IDTs 13 to 15 are as described in the following paragraphs.

IDT 13 . . . The number of electrode fingers is 29 in which the number of electrode fingers of the first portion is 4 and the number of electrode fingers of the second portion is 25.

IDT 14 . . . The number of electrode fingers is 33 in which the numbers of electrode fingers of the first portions on both sides are each 4 and the number of electrode fingers of the second portion is 33−8=25.

IDT 15 . . . The number of electrode fingers is 29 in which the number of electrode fingers of the first portion is 4 and the number of electrode fingers of the second portion is 25.

The above $\lambda I1$ indicating the wavelength of IDT is preferably approximately 3.90 $\mu$m, and $\lambda I2$ is preferably approximately 4.19 $\mu$m.

The number s of electrode fingers of the reflectors 16 and 17 are 100 and a wavelength $\lambda R$ is approximately 4.29 $\mu$m.

Taking the IDT 13 in FIG. 1 for example, the distance between the first portion and the second portion is the distance between the center of the electrode finger 13c and the center of the electrode finger 13b, which is approximately $0.25\lambda I1+0.25\lambda I2$. The distance between the first portion and the second portion of the other IDTs is preferably set in a similar manner as the above. Furthermore, the distance between the IDTs that are adjacent to each other, for example, the center distance between the electrode finger 14i of the IDT 14 and 15a of the IDT 15 which are adjacent to each other is preferably about 0.50 $\lambda I1$.

In addition, the distances between the IDTs 13 and 15 and the corresponding reflectors 16 and 17, that is, the mutual electrode finger center distances between the outer edge portions of the IDTs and the inner edge of the reflectors are preferably about $0.50\lambda R$.

The duty of each of the IDTs 13 to 15 is preferably about 0.73, and the duty of the reflectors is preferably about 0.55. The duty is the ratio of the electrode finger width to (the electrode finger width+the distance of the electrode finger spacing).

The IDTs 18 to 20 of the surface wave filter 12 and the reflectors 21 and 22 are constructed preferably in substantially the same manner as the IDTs 13 to 15 and the reflectors 16 and 17, respectively, are constructed.

The present preferred embodiment is characterized in that the distance between the first portion and the second portion and the distance between the IDTs that are adjacent to each other are designed in the above-described manner. As described in detail below, these distances are preferably about 0.50 times the wavelength of the adjacent IDTs. When the wavelengths on both sides of the spacing are different, it is preferable that the distance be obtained by adding approximately 0.25 times these wavelengths in order to maintain the continuity of the IDTs.

Figure 2:
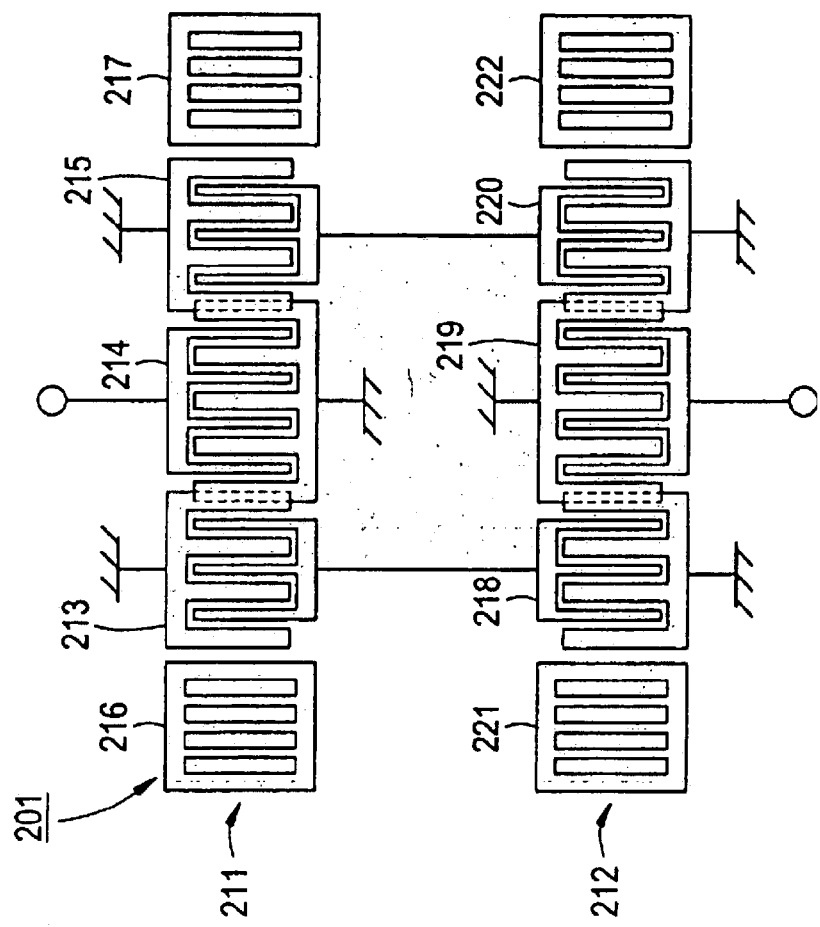
FIG. 2 is a model plan view indicating the electrode construction of a conventional longitudinally coupled resonator-type surface acoustic wave filter.

For comparison, a conventional longitudinally coupled resonator-type surface acoustic wave filter is provided. The electrode construction of this conventional longitudinally coupled resonator-type surface acoustic wave filter is shown in FIG. 2. As is obvious from FIG. 2, the longitudinally coupled resonator-type surface acoustic wave filter 201 is not provided with two types of spacing such as provided in the longitudinally coupled resonator-type surface acoustic wave filter 1. They are constructed in the same manner except that the distance of each electrode finger spacing part is identical. Therefore, concerning the identical parts, detailed descriptions thereof are omitted by assigning the reference numerals to the identical parts in which the reference numerals are obtained by adding 200 to the reference numeral indicating the parts of the longitudinally coupled resoator-type surface acoustic wave filter in the above-described preferred embodiment. The details of the electrode construction of the surface acoustic wave filter 201 provided for this comparison are as follows.

That is, the intersecting width W of the IDTs 213 to 215 and 218 to 220 is approximately 43.2λI. The numbers of electrode fingers of the IDTs are as follows:

IDTs 213, 215, 218, and 220 . . . 25; and
IDTs 214 and 219 . . . 31.

The wavelength λI of the IDT is preferably about 4.17 μm and the wavelength λR of the reflector is preferably about 4.29 μm. The numbers of electrode fingers of the reflectors are each 100.

The adjacent IDT to IDT electrode finger center distance is 0.32λI and the electrode finger center distance between the reflector and the IDT adjacent to the reflector is 0.50λR. In addition, the duty of the IDT and the duty of the reflector are the same as the preferred embodiment, and the electrode film thickness is 0.08λI.

Figure 3:
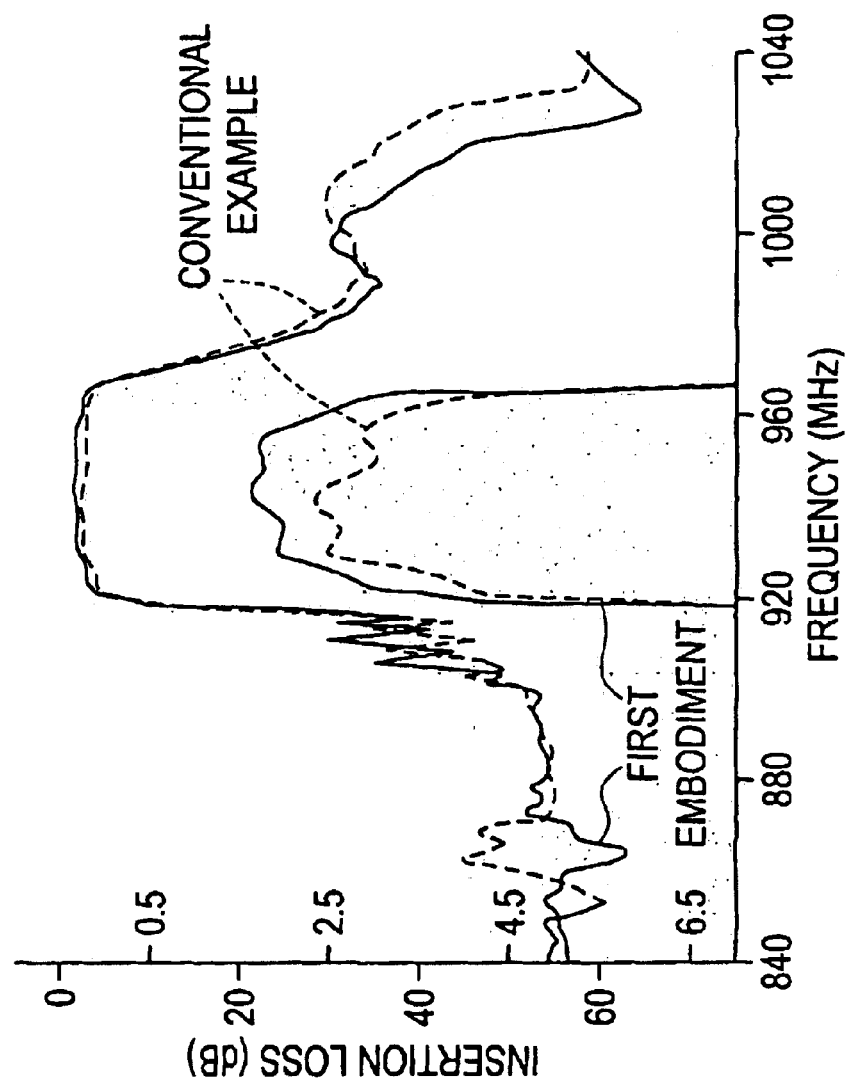
FIG. 3 is a diagram indicating the amplitude characteristics of the longitudinally coupled resonator-type surface acoustic wave filter according to the first preferred embodiment and the conventional example.

Amplitude characteristics of the longitudinally coupled resonator-type surface acoustic wave filter in the present preferred embodiment and in the conventional example that were prepared in the above-described manner were measured. The results are shown in FIG. 3. The solid lines in FIG. 3 represent the results of the present preferred embodiment and the dashed lines represent the results of the conventional example. Furthermore, characteristics obtained by magnifying important portions of each amplitude characteristic represented using the solid lines and the dashed lines by the scales on the right side of the vertical axis are also shown.

As obviously indicated in FIG. 3, the insertion loss in the passband can be much more improved in the longitudinally coupled resonator-type surface acoustic wave filter 1 according to the present preferred embodiment than in the conventional example. For example, the minimum insertion loss in the passband is approximately 2.3 dB in the conventional example while it is approximately 1.7 dB in the present preferred embodiment, which demonstrates the improvement by approximately 0.6 dB.

The bandwidth having the attenuation amount of 4.5 dB from a through level is approximately 44 MHz in the conventional example while the same band width having the attenuation amount of 3.9 dB from the through level can be obtained in the preferred embodiment. That is, when comparison is made with respect to the entirety of the passband, the insertion loss is improved by approximately 0.6 dB in the present preferred embodiment compared with the conventional example.

In the present preferred embodiment, the reason why the insertion loss can be improved in the above-described manner is as follows.

Figure 4:
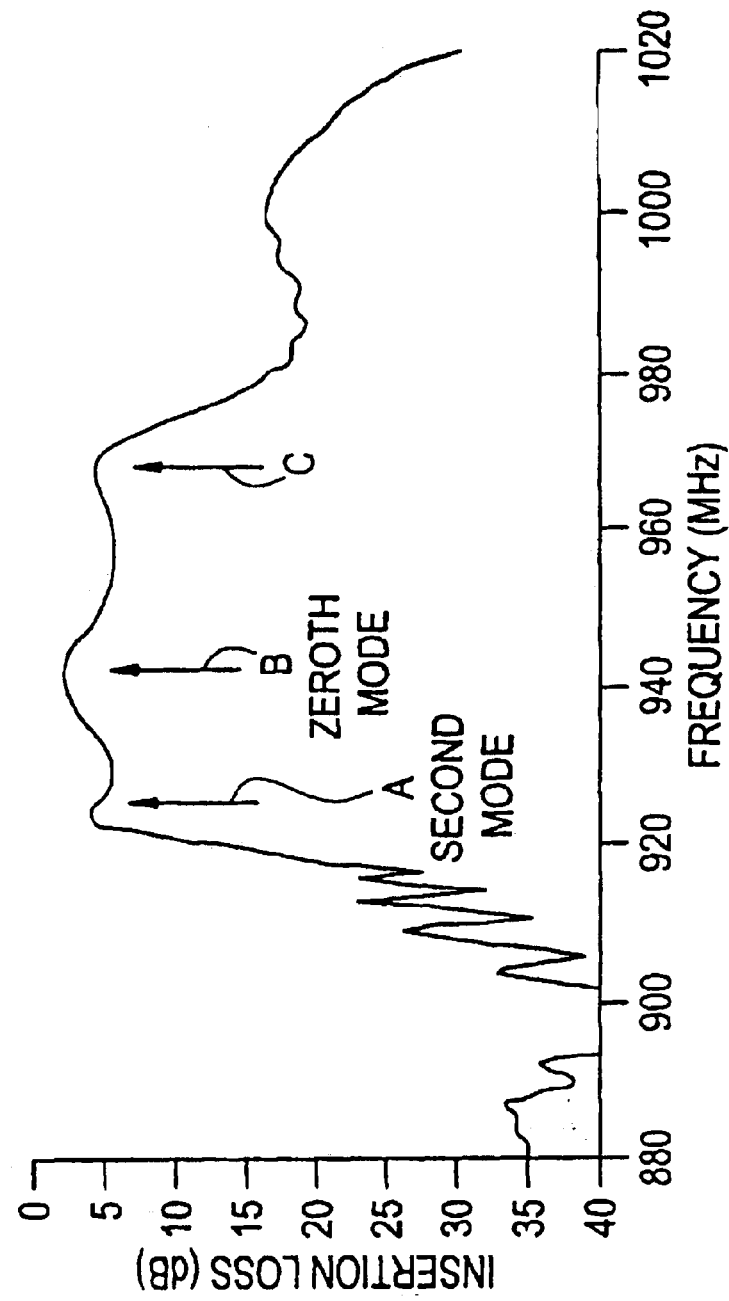
FIG. 4 is a diagram indicating the amplitude characteristics of the conventional longitudinally coupled resonator-type surface acoustic wave filter.
Figure 5:
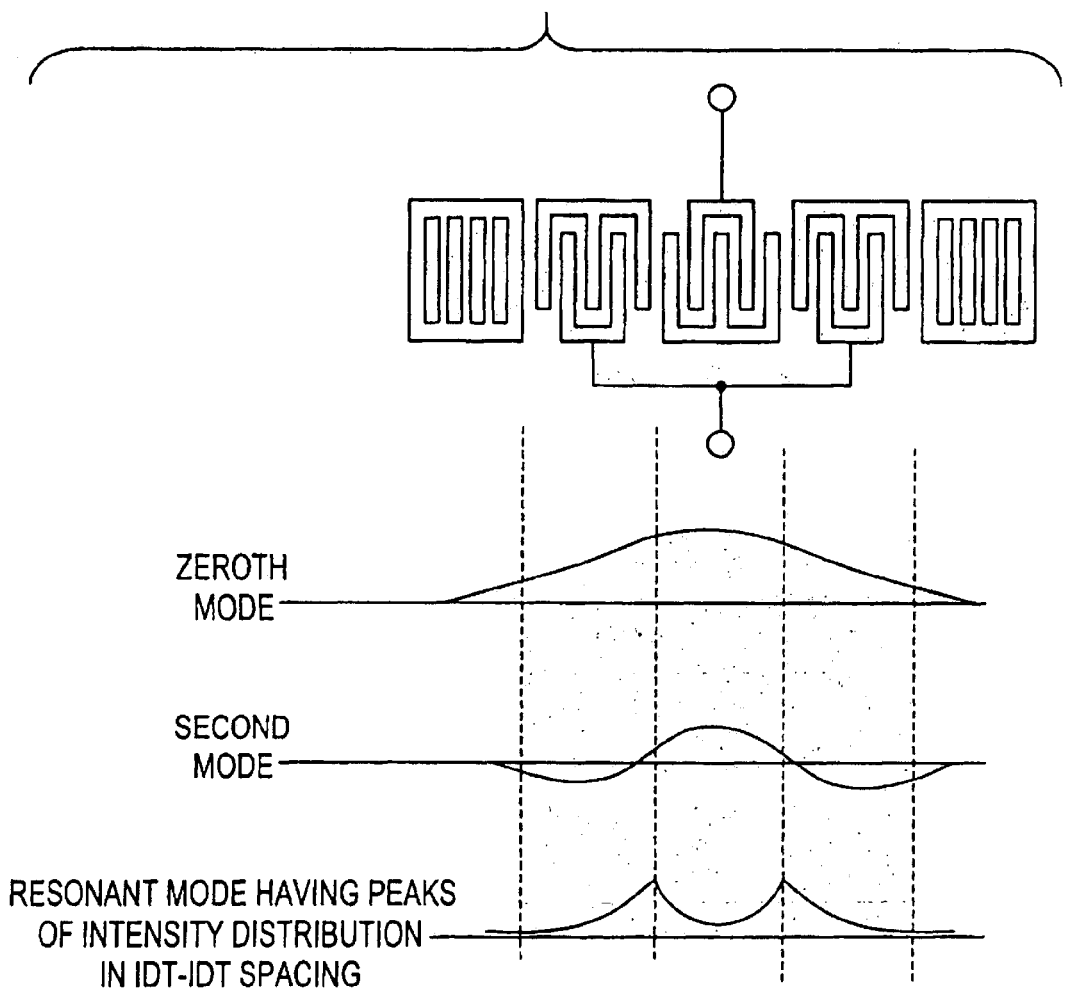
FIG. 5 is a model diagram illustrating the relationship between the electrode construction of the conventional three IDT type longitudinally coupled resonator-type surface acoustic wave filter and resonant modes.

In the design of the conventional three IDT type longitudinally coupled resonator-type surface acoustic wave filter, the electrode finger center distance between the IDTs that are adjacent to each other is around 0.25λI. This is because the passband is formed making use of three resonant modes having peaks indicated by three arrows A to C in frequency characteristics of the conventional surface acoustic wave filter shown in FIG. 4 clarified by changing the impedance from 50 Ω to 500 Ω. That is, in the electrode construction shown in FIG. 5, the passband is formed by making use of a resonant mode (the arrow C in FIG. 4) having a peak of the intensity distribution of the surface acoustic wave in an IDT-IDT spacing portion other than a zeroth mode (the arrow B shown in FIG. 4) and a second mode (the arrow A shown in FIG. 4) schematically shown below.

However, the distance of the IDT to IDT spacing is approximately 0.25λI, causing a discontinuous portion to occur in a surface acoustic wave propagation path. There arises a problem that the propagation loss increases because the amount of component radiated as the bulk wave increases in the discontinuous portion.

Therefore, in order to decrease the amount of the above-described propagation loss, it is considered that the discontinuous portion should be eliminated by setting the distance of the IDT to IDT spacing to about 0.50λI. However, when the distance of the IDT to IDT spacing is about 0.50λI, since the above three modes are not available, there arises a problem in that realization of a wider band cannot be achieved.

The present preferred embodiment is characterized in that, in order to solve the two problems described above, the above first and second portions are provided between the IDTs that are adjacent to each other. That is, by partially altering the electrode finger pitch in the IDT, while the passband is formed making use of the three resonant modes, the amount of loss radiated as the bulk wave is reduced by setting the distance of the IDT to IDT spacing to approximately 0.50 times the wavelengths of the IDT on both sides of the spacing.

Generally, when the period of the electrode finger is smaller than the wavelength of the surface wave propagating through the propagating path, the propagation loss of the surface acoustic wave itself decreases. Therefore, as described above, since the electrode finger pitch of the first portion is smaller than that of the second portion, this also reduces the propagation loss of the surface acoustic wave.

Therefore, as is shown in FIG. 3, although the same passband width as in the conventional example in which the realization of a wider band is achieved is obtained in the present preferred embodiment, the insertion loss in the passband can be greatly reduced compared to the conventional example.

The inventor examined how small the electrode finger pitch of the first portion should be constructed compared to that of the second portion, so that preferable results can be obtained.

That is, the electrode finger pitch of the first portion of the longitudinally coupled resonator-type surface acoustic wave filter was changed variously in the preferred embodiment shown in FIG. 1 to examine how the propagation loss is changed because of this. The results are shown in FIG. 6.

Figure 6:
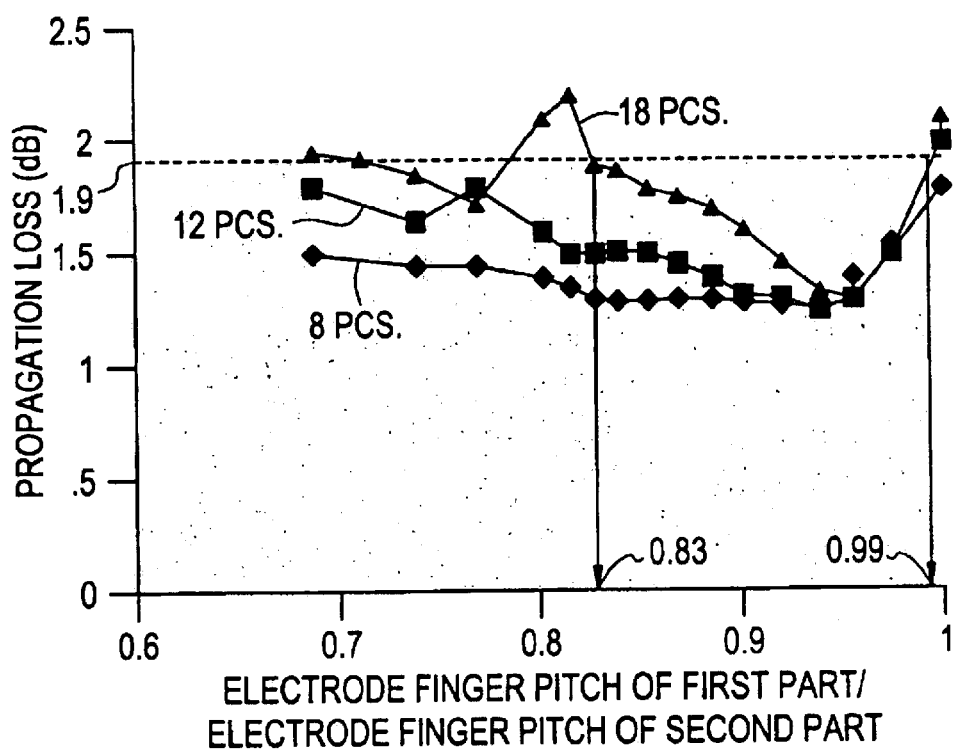
FIG. 6 is a diagram indicating the relationship between the ratio of the electrode finger pitch of a first portion to the electrode finger pitch of a second portion of the longitudinally coupled resonator-type surface acoustic wave filter and the propagation loss according to the first preferred embodiment.

The horizontal axis of FIG. 6 represents the ratio of the electrode finger pitch of the first portion to the electrode finger pitch of the second portion (referred to this as the pitch ratio of a narrow-pitch electrode finger) while the vertical axis represents the propagation loss. The propagation loss in FIG. 6 is the value obtained by subtracting the loss due to impedance mismatch and the ohmic loss caused by the electrode finger resistance component from the insertion loss in the passband.

When the results in FIG. 6 were obtained, the results of a case are shown in which the numbers of electrode fingers having narrow electrode finger pitch were 8, 12, and 18. Here, as examples of the IDTs 13 to 15, the number of electrode fingers having the narrow electrode finger pitch means the total sum of the number of electrode fingers of the first portion of the IDT 13 (two fingers are shown in FIG. 1) and the number of narrow-pitch electrode fingers of the first portion of the IDT 14 on the IDT 13 side (two fingers are shown in FIG. 1). In this case, four fingers are shown in FIG. 1. However, eight fingers, twelve fingers, or eighteen fingers are provided as described above.

Likewise, the total numbers of narrow electrode-finger-pitch electrode fingers in the adjacent portion between the IDT 15 and the IDT 14 are also 8, 12, and 18 though four fingers are shown in FIG. 1. That is, FIG. 1 shows a design in the number of narrow electrode-finger-pitch electrode fingers is four. In the following description, that "the number of narrow-pitch electrode fingers" means the value defined in the above described manner.

As is obviously indicated in FIG. 6, when the pitch ratio of the narrow-pitch electrode finger is in the proximity of approximately 0.95, the propagation loss is minimized regardless of the number of narrow-pitch electrode fingers. The amount corresponding to the improvement in this propagation loss is considered to be the sum of the amount corresponding to reduction in the loss radiated as the bulk wave and the amount corresponding to reduction in the propagation loss of the surface acoustic wave by decreasing the electrode finger pitch.

That is, in order to decrease the insertion loss in the band, it was found to be preferable that the pitch ratio of the above narrow-pitch electrode finger is set to the order of this value.

Next, a range in which the propagation reduction was smaller compared to the conventional example was determined. In the design using the conventional method, the propagation loss is approximately 1.9 dB. As described below, in this preferred embodiment, it is preferable that the number of narrow-pitch electrode fingers be 18 or below.

As is obviously indicated FIG. 6, the range in which the reduction effect of the propagation loss can be observed is in the range of the pitch ratio of the narrow-pitch electrode finger of about 0.83 to about 0.99. Even though the pitch ratio of the narrow-pitch electrode finger is below approximately 0.83, the propagation loss is small under an appropriate condition. However, considering the restriction of the electrode manufacturing accuracy, it is found to be preferable that the pitch ratio be in the proximity of about 0.83 to about 0.99.

Figure 7A:
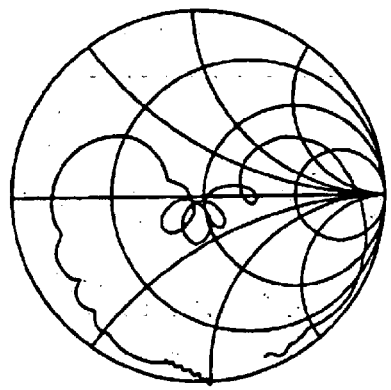
FIGS. 7(a) and 7(b) are diagrams showing reflection characteristics in each of cases in which the number of narrow-pitch electrode fingers of the longitudinally coupled resonator-type surface acoustic wave filter according to the first preferred embodiment is eight and twelve.
Figure 7B:
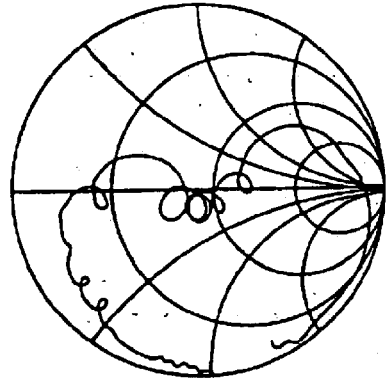

Next, a preferable range of the number of narrow-pitch electrode fingers was confirmed. FIG. 7 shows reflection characteristics in cases in which, when the numbers of narrow-pitch electrode fingers are set to 8 and 12, design parameters are adjusted for each so that impedance matching is achieved in the corresponding pass band. FIG. 7($a$) shows the case in which the number of narrow-pitch electrode fingers is 8; and FIG. 7($b$) shows the case in which the number of narrow-pitch electrode fingers is 12.

When the number of narrow-pitch electrode fingers is increased, there is a tendency to worsen the concentration ratio of the impedance, which tends to worsen VSWR or the deviation in the band. In addition, since the deviation in the passband is worsened, the passband width tends to be narrowed. Accordingly, using the design of the above-described preferred embodiment as a baseline, the changes in VSWR as well as the passband width were measured in a case in which the number of narrow-pitch electrode fingers was changed. The results are shown in FIGS. 8 and 32.

Figure 8:
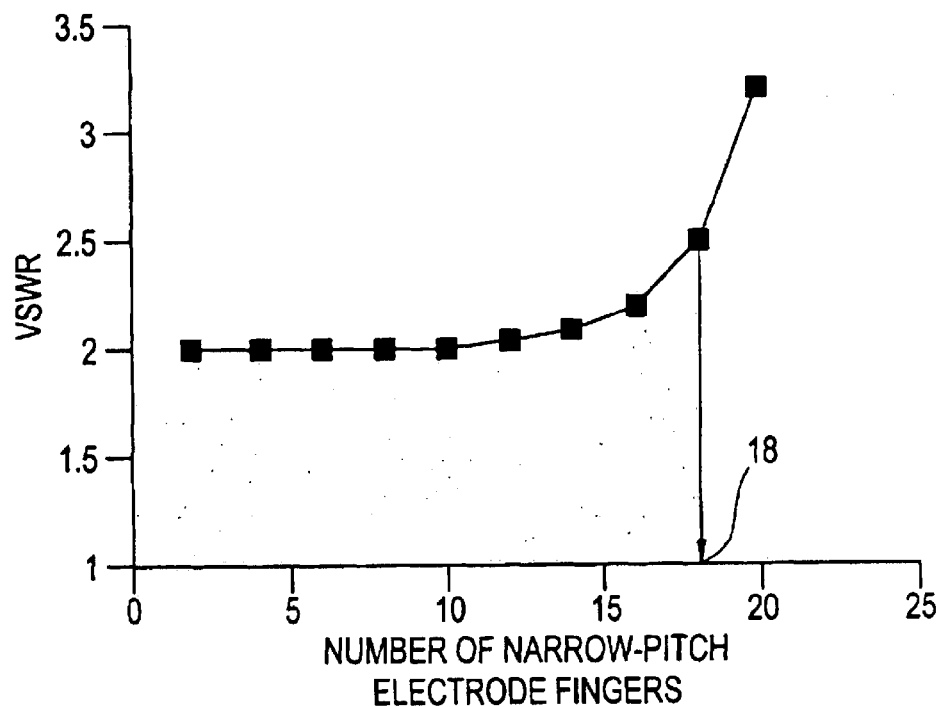
FIG. 8 is a graph indicating the change in VSWR in a case in which the number of narrow-pitch electrode fingers is caused to be changed in the first preferred embodiment.
Figure 32:
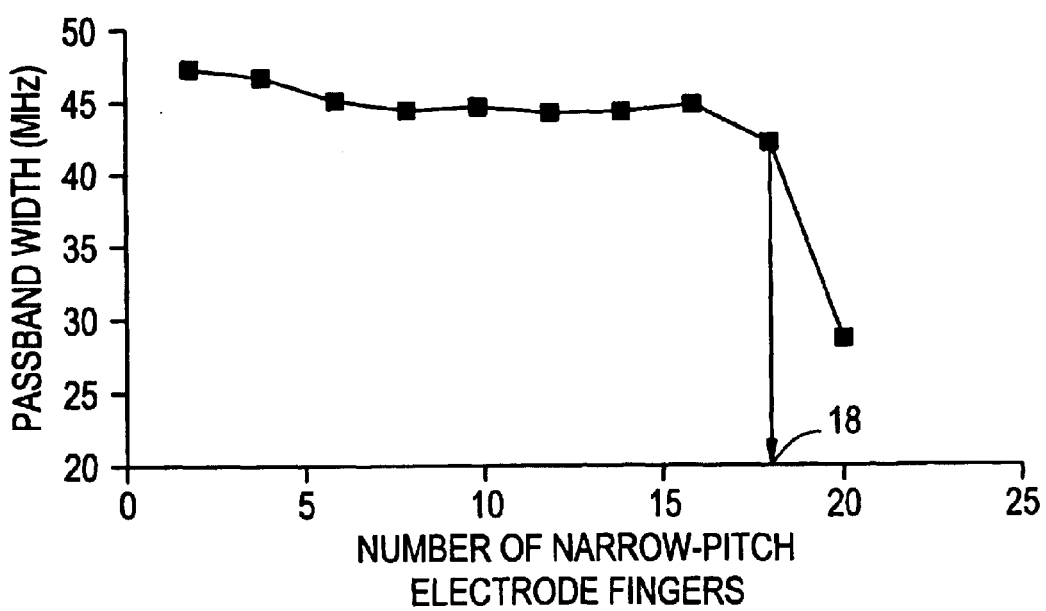
FIG. 32 is a graph indicating the relationship between the number of narrow-pitch electrode fingers and the passband width.

The value of VSWR in FIG. 8 and the value of the passband width in FIG. 32 are the values in a case in which the intersecting width, the pitch of the narrow-pitch electrode fingers and the like are varied so that the impedance matching in the passband is achieved in accordance with the number of narrow-pitch electrode fingers. Generally, the value of VSWR is preferably about 2.5 or below, and the passband width is preferably approximately 42 MHz or above in an EGSM method considering the change in characteristics due to the temperature, characteristic variations or other characteristics.

In FIG. 8, the number of narrow-pitch electrode fingers is 18 or below in a range in which VSWR is about 2.5 or below. As is obvious from FIG. 32, the number of narrow-pitch electrode fingers is also 18 or below in which the passband is approximately 42 MHz or above. That is, it is preferable that the number of narrow-pitch electrode fingers be 18 or above. This increases the concentration ratio of the impedance and decreases VSWR as well as the deviation in the band. In addition, it was discovered that this enables the longitudinally coupled resonator-type surface acoustic wave filter having a sufficient passband width to be obtained.

Figure 33:
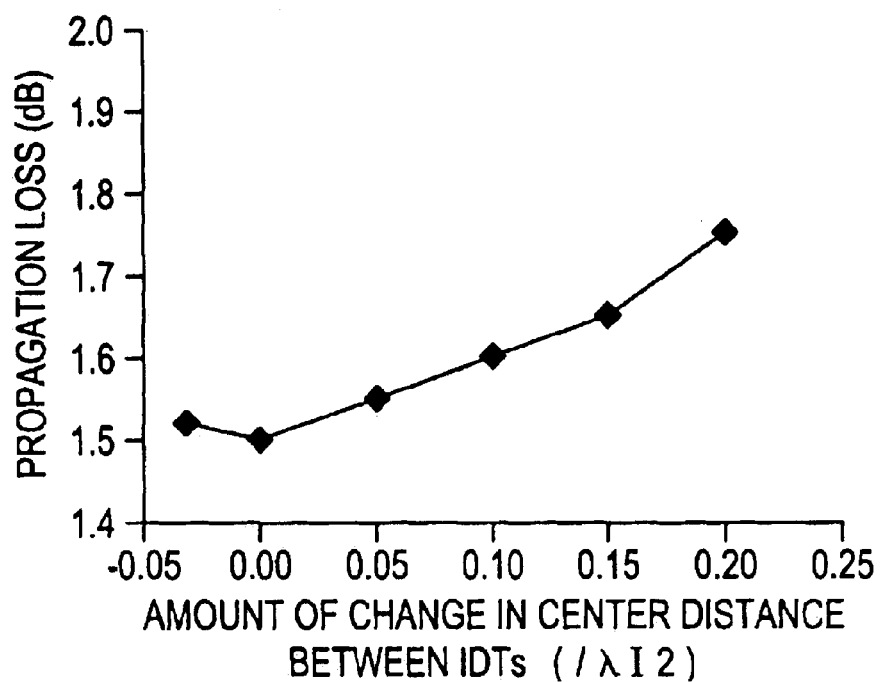
FIG. 33 is a graph indicating the relationship between the amount of change in the center distance of the IDT and the propagation loss.

Next, the change in the propagation loss was examined in a case in which the distance between the adjacent IDTS was changed from what was used in the present preferred embodiment. The results are shown in FIG. 33. The distance between the adjacent IDTs, for example, the center distance between the adjacent electrode fingers 14$i$ and 15$a$ of the IDT 14 and the IDT 15 in FIG. 1, respectively, is preferably about 0.50λI1. In FIG. 33, the change in the propagation loss is plotted with respect to the change in the center distance from where the value 0.50λI1 is set as 0. In FIG. 33, the propagation loss is worsened in accordance with the change in the center distance between the adjacent IDTs. That is, it is proved to be preferable that the center distance between the adjacent IDTs be about 0.50λI1 in order to obtain a low loss filter. Likewise, it is preferable that the distance between the first portion and the second portion whose pitches are different be approximately 0.25λI1+0.25λI2, as shown in the present preferred embodiment, in order to obtain the low loss filter.

Figure 34:
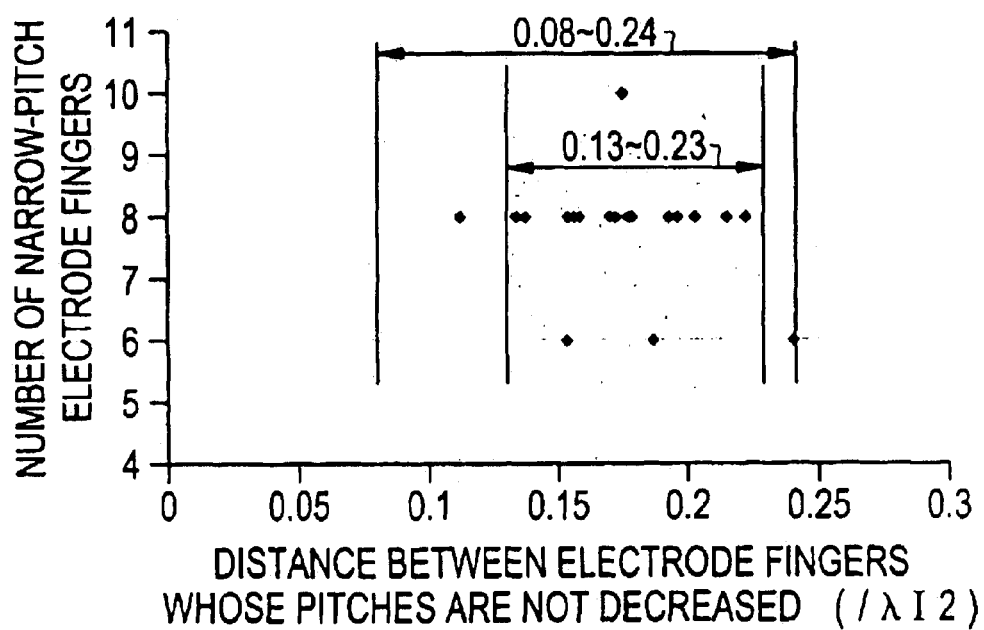
FIG. 34 is a graph illustrating a preferable range of an electrode finger spacing distance having a pitch that is not decreased in which the relationship between the electrode finger spacing distance whose pitch is not decreased and the number of narrow-pitch electrode fingers for obtaining preferable filtering characteristics is shown.

Next, the center distance between the electrode fingers whose pitch is not decreased, for example, the center distance between the electrode fingers 13$c$ and 14$c$ shown in FIG. 1 was examined concerning how long the center distance between the electrode fingers 13$c$ and 14$c$ is desired. The results are shown in FIG. 34. FIG. 34 shows the results obtained by examining the center distance between the electrode fingers whose pitch is not decreased in a case in which the construction of preferred embodiments of the present invention is designed so that the filter has optimized characteristics for various applications such as not only the EGSM method, but also a DCS method, and a PCS method. In all of these designs, it is designed so that the bandwidth required for each method is obtained and VSWR is approximately 2.5 or below. The horizontal axis represents a value indicating the center distance between the electrode fingers whose pitch is not decreased using the wavelength ratio of the electrode fingers whose pitch is not decreased. This value is the one so that every value is in the range of approximately 0.0 to about 0.5 by subtracting the value of 0.5n (n=1, 2, 3, . . .) from the corresponding center distance in each case. For example, when the wavelength ratio is approximately 4.73, plotting is made as approximately 0.23 in FIG. 34.

In FIG. 34, center distances between the electrode fingers whose pitches are not decreased are concentrated in the range of approximately 0.13 to about 0.23. Furthermore, in all cases, they are in the range of about 0.08 to about 0.24. In the related art shown in FIG. 2, these center distances are preferably in the range of approximately 0.25 to about 0.30. In the case of preferred embodiments of the present invention, it is indicated that the center distances should be in the range of about 0.08 to about 0.24, and preferably, in the range of about 0.13 to about 0.23.

Although the 36° Y-cut X-propagating $LiTaO_3$ substrate is used in the present preferred embodiment, a $LiTaO_3$ substrate having another crystal orientation, the $LiNbO_3$ substrate, or other suitable substrates may be used. For example, a particularly great effect can be obtained in the piezoelectric substrate using the leaky wave, such as a 36° to 44° Y-cut X-propagating $LiTaO_3$ substrate, a 64° to 72° Y-cut X-propagating $LiNbO_3$ substrate, or a 41° Y-cut X-propagating $LiNbO_3$ substrate.

Figure 9:
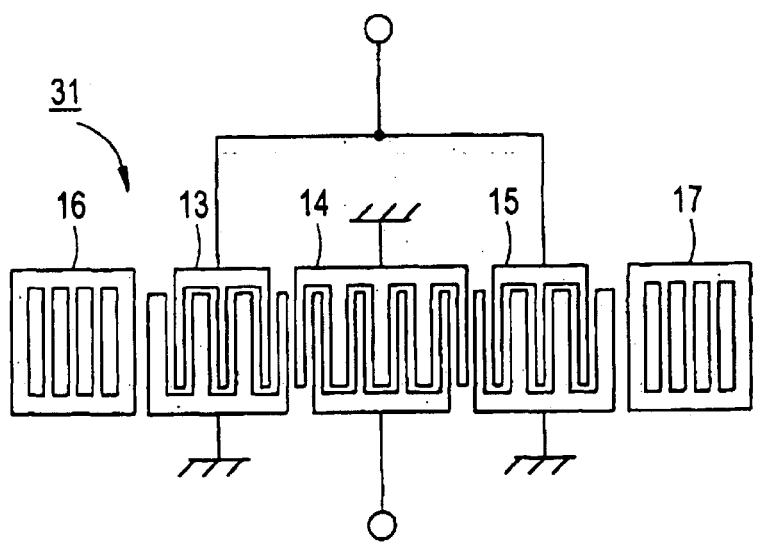
FIG. 9 is a model plan view indicating the electrode construction of a one-stage longitudinally coupled resonator-type surface acoustic wave filter according to a modified example of the first preferred embodiment.
Figure 10:
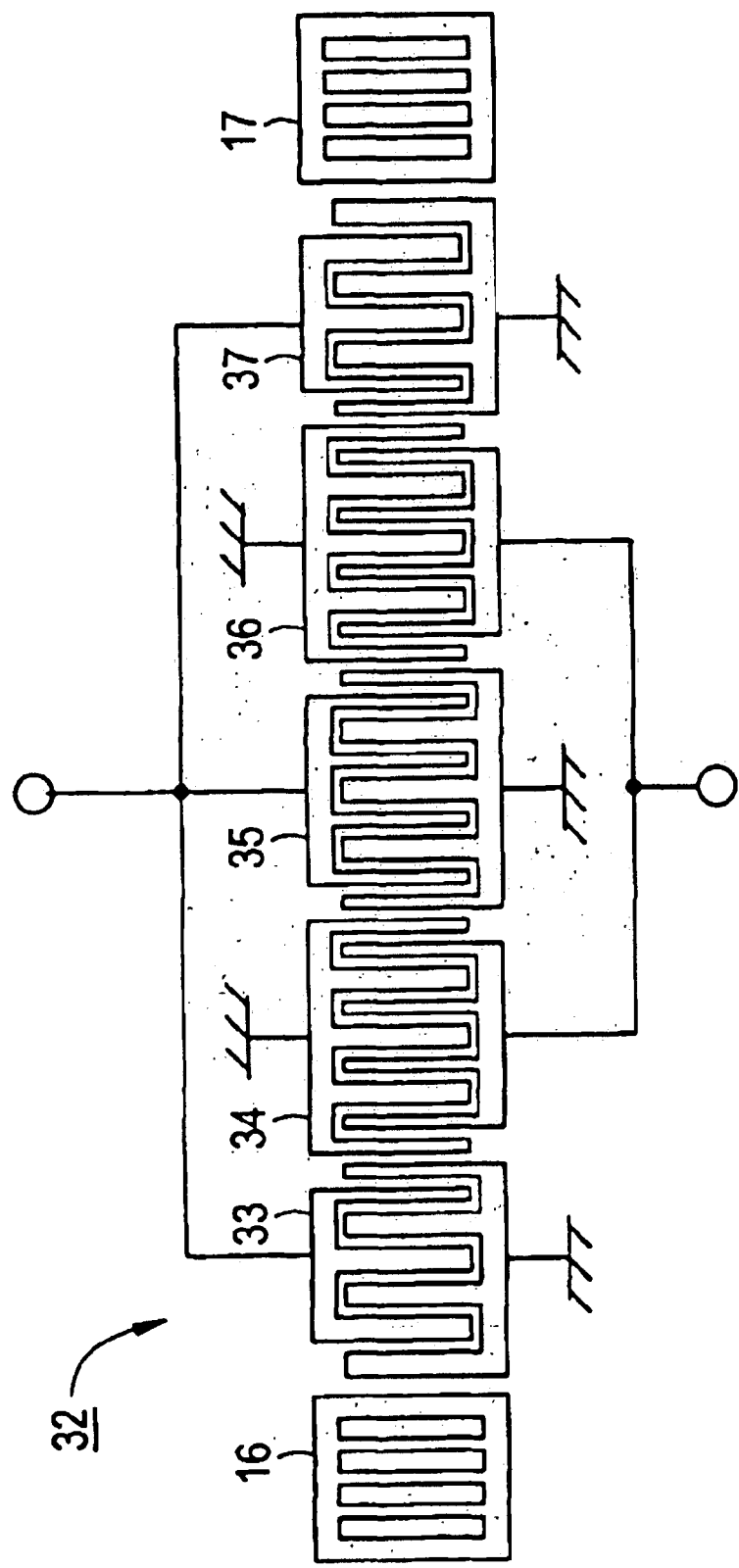
FIG. 10 is a model plan view indicating the electrode construction of another modified example of the longitudinally coupled resonator-type surface acoustic wave filter according to the first preferred embodiment.

In the present preferred embodiment, three IDT type longitudinally coupled resonator-type surface acoustic wave filters establish the two-stage vertical connection. As shown in FIG. 9, the advantages obtained in preferred embodiments of the present invention can be obtained by using the same construction as that of the present preferred embodiment in the one-stage longitudinally coupled resonator-type surface acoustic wave filter 31. Furthermore, the present invention is not limited to the filter having three IDTs. For example, the advantages of the present invention can be obtained by applying the present invention to a longitudinally coupled resonator-type surface acoustic wave filter 32 as shown in FIG. 10 having five IDTs 33 to 37.

That is, in various preferred embodiments of the present invention, the number of IDTs of the longitudinally coupled resonator-type surface acoustic wave filter is not limited to three. It may be five or above. In addition, the longitudinally coupled resonator-type surface acoustic wave filter is not necessarily limited to ones having a multiple-stage construction.

Figure 11:
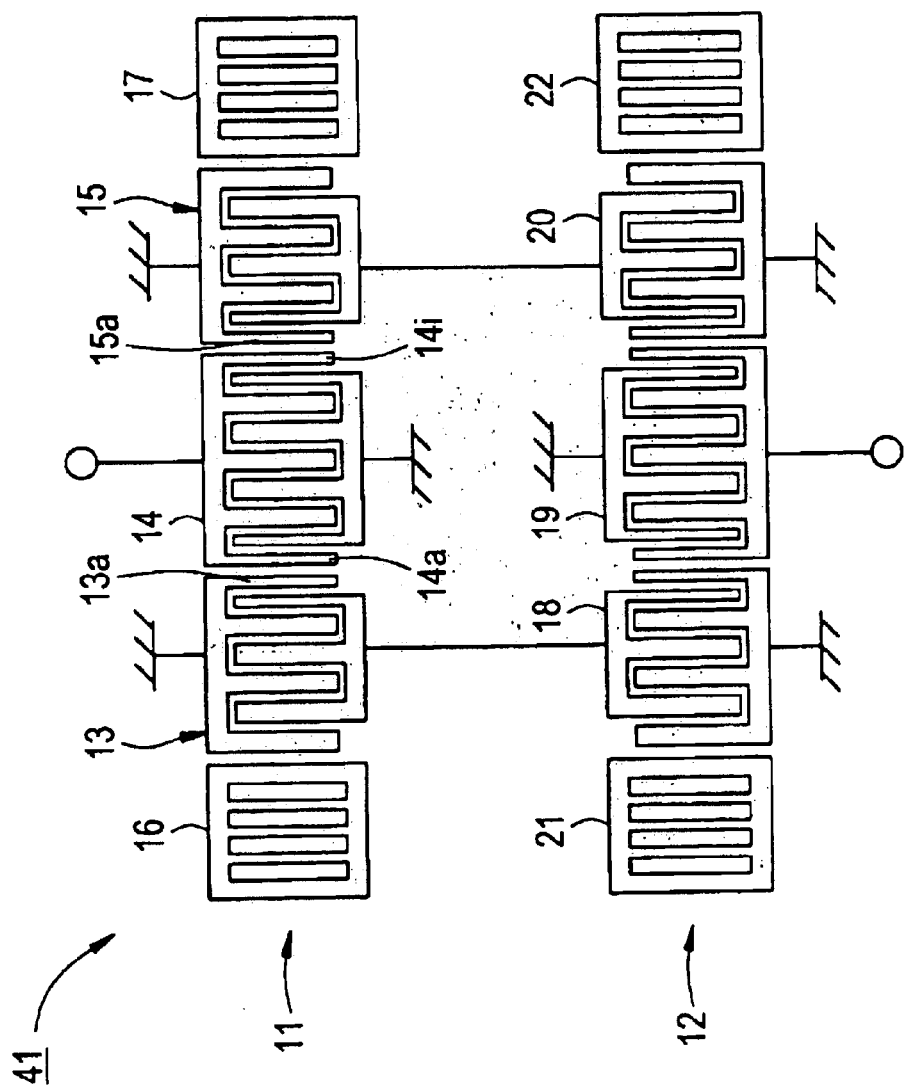
FIG. 11 is a model plan view indicating the electrode construction of a longitudinally coupled resonator-type surface acoustic wave filter according to a second preferred embodiment of the present invention.

FIG. 11 is a schematic plan view showing the electrode construction of a longitudinally coupled resonator-type surface acoustic wave filter according to the second preferred embodiment of the present invention.

A longitudinally coupled resonator-type surface acoustic wave filter 41 according to the second preferred embodiment is constructed exactly in the same manner as the longitudinally coupled resonator-type surface acoustic wave filter 1 except that the IDTs 14 and 19 which are provided in the middle in the propagation direction of the surface acoustic wave are inverted.

That is, while the adjacent electrode fingers of the adjacent IDTs are grounded in the first preferred embodiment, the outermost electrode fingers of the IDTs 14 and 19 are connected to the corresponding input and output terminals instead of the ground potential. Therefore, the electrode finger which is a signal electrode and the electrode finger which is connected to the ground potential of the outer IDT are adjacent between the adjacent IDTs.

To be specific, while the electrode fingers 13a and 15a which are the corresponding edge portions of the IDTs 13 and 15 on the IDT 14 side are connected to the ground potential, the electrode fingers 14a and 14i of the IDT 14 which are adjacent to the corresponding electrode fingers 13a and 15a are connected to input terminals. That is, the polarities of the electrode fingers, which are adjacent to each other, are inverted between the IDTs that are adjacent to each other. The surface acoustic wave filter 12 is also constructed in the same manner.

Therefore, the longitudinally coupled resonator-type surface acoustic wave filter according to the second preferred embodiment has a construction in which the adjacent electrode fingers between the adjacent IDTs with inverted polarities are two-stage vertically connected.

Figure 12:
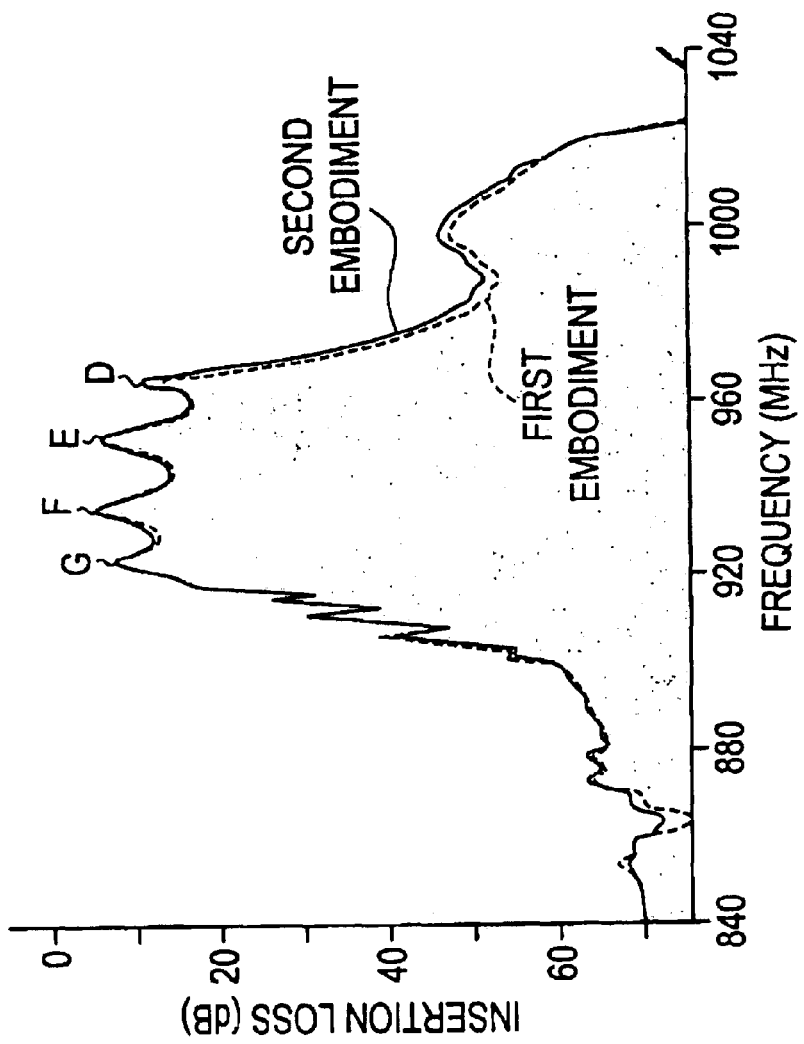
FIG. 12 is a graph illustrating the difference between the resonant mode of the longitudinally coupled resonator-type surface acoustic wave filter according to the second preferred embodiment and the resonant mode of the longitudinally coupled resonator-type surface acoustic wave filter according to the first preferred embodiment.

FIG. 12 shows differences between the resonant mode of the surface acoustic wave filter 41 according to the second preferred embodiment and the resonant mode of the surface acoustic wave filter 1 according to the first preferred embodiment. Here, the results obtained by changing the input/output impedance from 50 Ω to 500 Ω and by confirming the resonant mode are shown.

In FIG. 12, the solid line indicates the result according to the second preferred embodiment and the dashed line indicates the result according to the first preferred embodiment.

Reference character D of FIG. 12 indicates the resonant mode of a standing wave having peaks of the intensity distribution of the surface acoustic wave in the IDT to IDT spacing, E indicates the zeroth mode, G indicates the second mode, and F indicates a mode generated due to a two-stage vertical connection.

The major difference between the first preferred embodiment and the second preferred embodiment is that the level of the resonant mode indicated by the arrow D is larger in the second preferred embodiment.

Since the adjacent electrode fingers of the adjacent IDTs are connected to the ground potential in the first preferred embodiment, the surface acoustic wave in the IDT to IDT spacing cannot be converted into an electrical signal. As a result, the conversion efficiency to the electrical signal of the resonant mode D having the peaks of the intensity in IDT to IDT spacing is decreased.

On the other hand, since the polarities of the adjacent electrode fingers of the adjacent electrode IDTs are inverted in the second preferred embodiment, the surface acoustic wave can be converted into the electrical signal even in the IDT-IDT spacing. Therefore, the conversion efficiency to the electrical signal having the above resonant mode D is increased.

Figure 13:
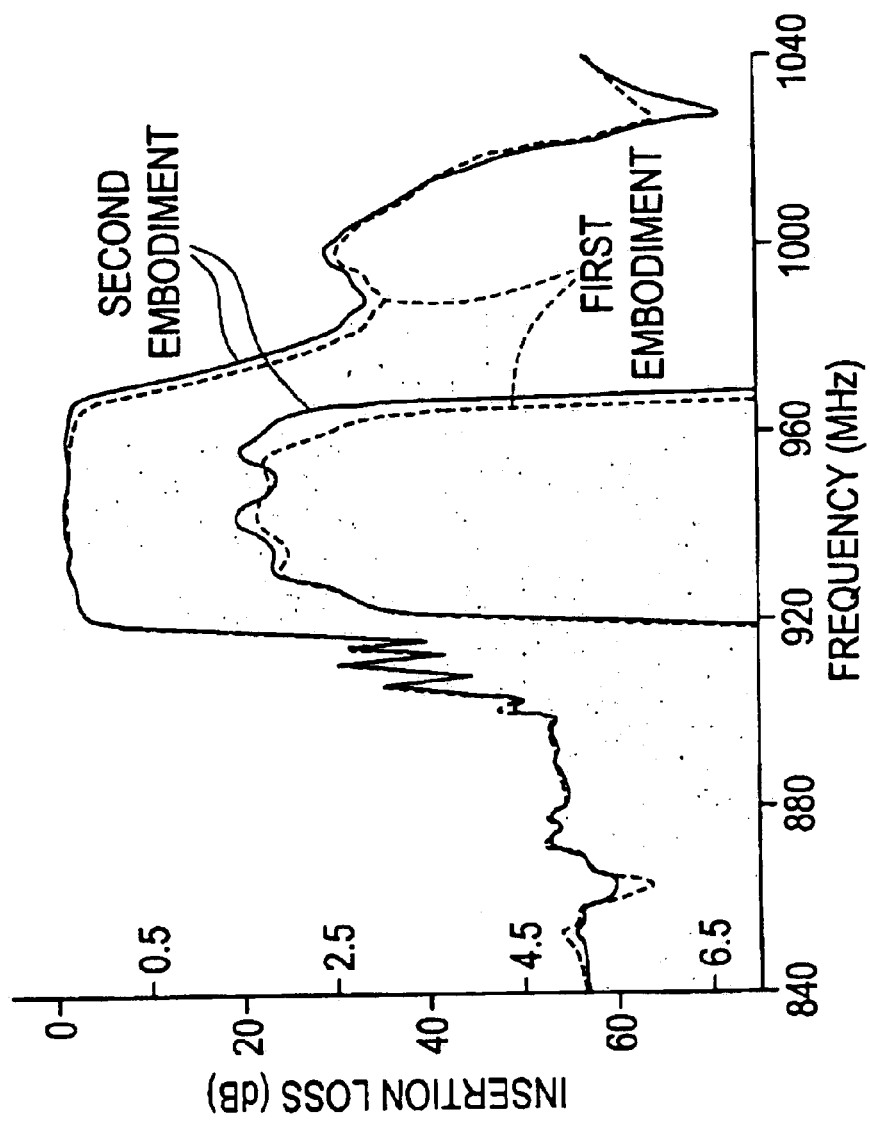
FIG. 13 is a graph indicating the amplitude characteristics of the longitudinally coupled resonator-type surface acoustic wave filters according to the second and first preferred embodiments.

FIG. 13 shows the amplitude characteristics of the longitudinally coupled resonator-type surface acoustic wave filters according to the second preferred embodiment and the first preferred embodiment and the corresponding amplitude characteristics obtained by magnifying the insertion loss of the vertical axis by the scale on the right side of the axis. The amplitude characteristics of the second preferred embodiment (the solid line) of FIG. 13 are obtained by changing the intersecting width from the design condition in the first preferred embodiment to approximately 33.4λI2 and the wavelength of the narrow-pitch electrode fingers therefrom to approximately 3.88 μm in order to adjust the deviation in the impedance caused by the change in the frequency of the mode and the level of the mode.

As is indicated in FIG. 13, according to the second preferred embodiment, the insertion loss in the passband can be even more improved than the first preferred embodiment (dashed line) and the passband width becomes wider. Accordingly, it is preferable that the polarities of the adjacent electrode fingers of the adjacent IDTs be inverted. This enables the longitudinally coupled resonator-type surface acoustic wave filter having much less insertion loss and wider passband to be provided.

The advantages of the second preferred embodiment can also be obtained in a case in which the polarities of the adjacent electrode fingers between the IDTs are inverted in the above described manner in only one of the longitudinally coupled resonator-type surface acoustic wave filters 11 and 12 that establish the two-stage vertical connection.

Figure 14:
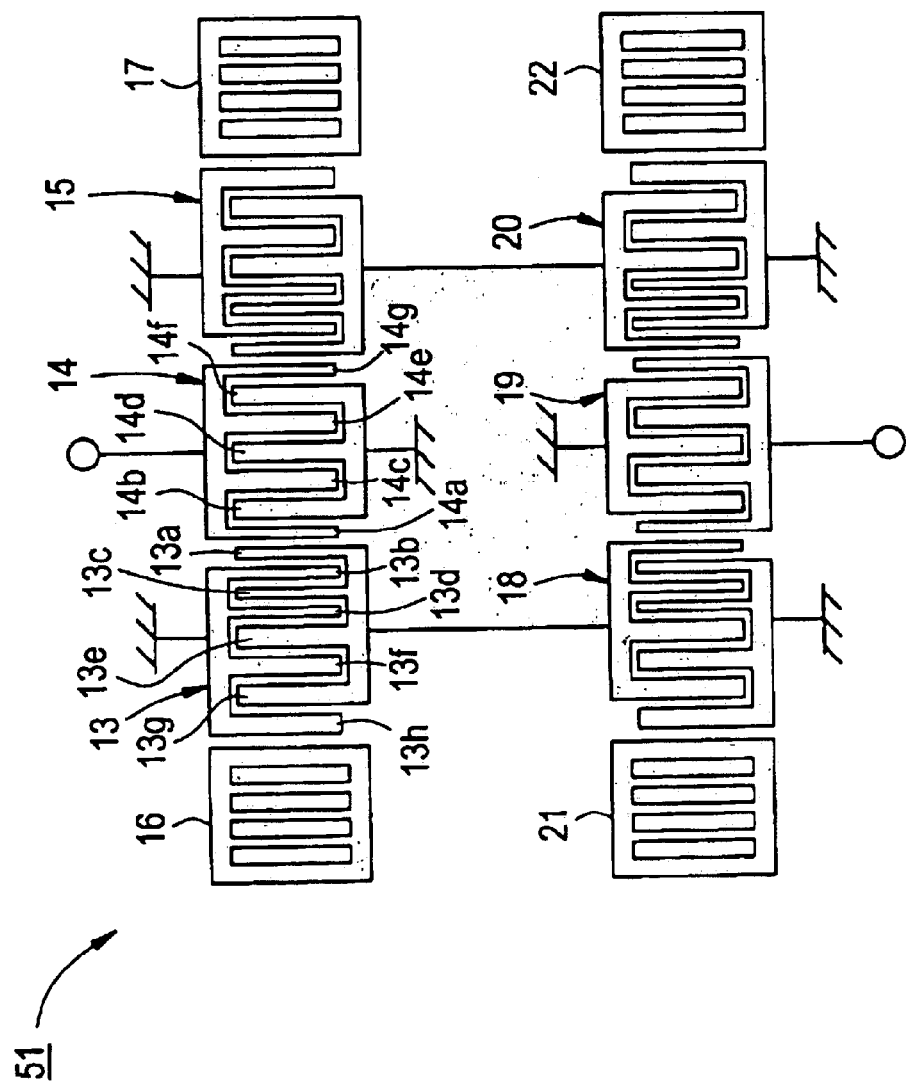
FIG. 14 is a model plan view indicating the electrode construction of a longitudinally coupled resonator-type surface acoustic wave filter according to a third preferred embodiment of the present invention.

FIG. 14 is a schematic plan view showing an electrode construction of a longitudinally coupled resonator-type surface acoustic wave filter according to the third preferred embodiment of the present invention.

A surface acoustic wave filter 51 according to the third preferred embodiment is constructed so that the number of narrow-pitch electrode fingers is preferably the same as that in the first preferably embodiment and the number of narrow-pitch electrode fingers of the first portion of the IDT 13 is different from the number of narrow-pitch electrode fingers of the first portion of the IDT 14 on the IDT 13 side. In addition, it is preferably constructed so that the number of narrow-pitch electrode fingers of the first portion of the IDT 15 is different from the number of narrow-pitch electrode fingers of the first portion of the IDT 14 on the IDT 15 side. Otherwise, since it is constructed in the same manner as the first preferred embodiment, by assigning the same reference numerals used in the first preferred embodiment to the corresponding components, descriptions of the corresponding elements of the first preferred embodiment are applied. Those elements which are different from the first preferred embodiment, are described more specifically. In the present preferred embodiment, the numbers of electrode fingers of the IDTs 13 to 15 of the surface acoustic wave filter 12 are as described in the following paragraph.

IDT13 . . . 30, in which the number of electrode fingers of the first portion is 5 and the number of electrode fingers of the second portion is 25.

IDT14 . . . the number of electrode fingers is 33, in which the first portions on both sides each have three narrow-pitch electrode fingers and the second portion provided in the middle has 27 electrode fingers.

IDT15 . . . 30, in which the number of electrode fingers of the first portion is 5 and the number of electrode fingers of the second portion is 25.

In the present preferred embodiment as well, the surface acoustic wave filters 11 and 12 are preferably constructed in the same manner. In FIG. 14, in order to simplify illustrations, the electrode fingers are shown in such a manner that the number of electrode fingers is decreased. That is, FIG. 14 is shown as though the narrow-pitch electrode finger is provided on each of the left and the right of the IDT 14, and the numbers of narrow-pitch electrode fingers of the first portion of the IDTs 13 and 15 are 3.

Figure 15A:
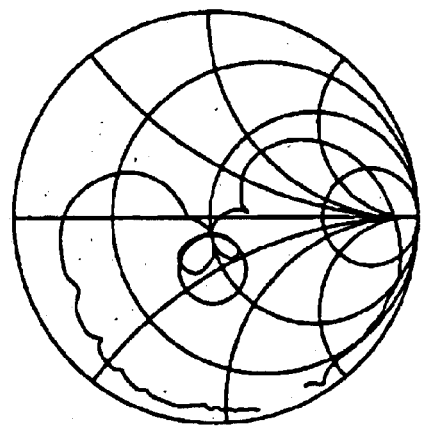
FIGS. 15(a) to 15(c) are diagrams each indicating the reflection characteristics of the longitudinally coupled resonator-type surface acoustic wave filter according to the first preferred embodiment, the longitudinally coupled resonator-type surface acoustic wave filter according to the third preferred embodiment, and a construction obtained by changing the balance of the number of narrow-pitch electrode fingers in the longitudinally coupled resonator-type surface acoustic wave filter according to the third preferred embodiment.
Figure 15B:
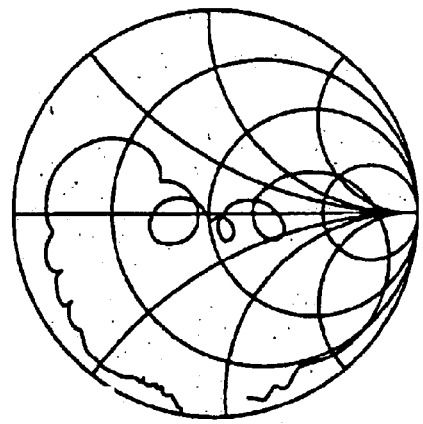
Figure 15C:
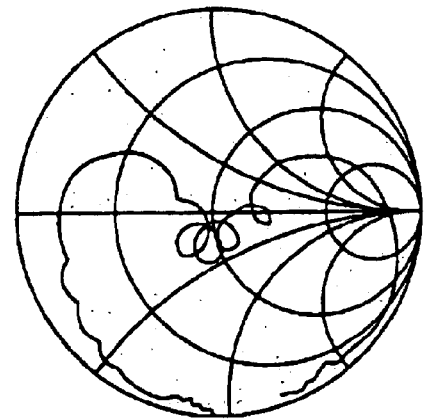

The reflection characteristic of the vertically-coupled resonator-type surface acoustic wave filter 51 according to the present preferred embodiment is shown in FIG. 15(b). For comparison, the reflection characteristic of the surface acoustic wave filter according to the first preferred embodiment is shown in FIG. 15(c).

The third preferred embodiment is constructed so that the numbers of narrow-pitch electrode fingers of the first portions of both of the IDTs that are adjacent to each other are different. In addition, the electrode finger intersecting width is approximately 47.7λI2 in order to match the impedance to 50 Ω.

As is indicated in FIG. 15, the impedance concentration ratio in the third preferred embodiment is worse than in the first preferred embodiment.

The reflection characteristic is shown in FIG. 15(a) in a case in which, on the contrary, the number of narrow-pitch electrode fingers of IDT 14 is increased. Changes in this case are that, in the third preferred embodiment, the total number of electrode fingers of the IDTs 13, 15, 18, and 20 is 28, the number of electrode fingers of the first portion is 3, the number of electrode fingers of the second portion is 25, the total number of electrode fingers of the IDTs 14 and 19 provided in the middle is 37 in which the numbers of electrode fingers of the first portions on both sides are each 5, the number of electrode fingers of the second portion in the middle is 27, and the intersecting width is approximately 28.6λI2. As is indicated in FIG. 15(a), in this case, the impedance concentration ratio is increased compared to the first preferred embodiment though the overall impedance is capacitive.

The third preferred embodiment and a modified example having the reflection characteristics shown in FIG. 15(b) are not exactly preferred embodiments for an EGSM type receivingstage band-pass filter. However, the third preferred embodiment and the modified example are effective for other applications. For example, as shown in FIG. 15(b), when the impedance concentration ratio is worsened, though the deteriorating tendency in VSWR is observed, the passband width tends to be widened.

Figure 16A:
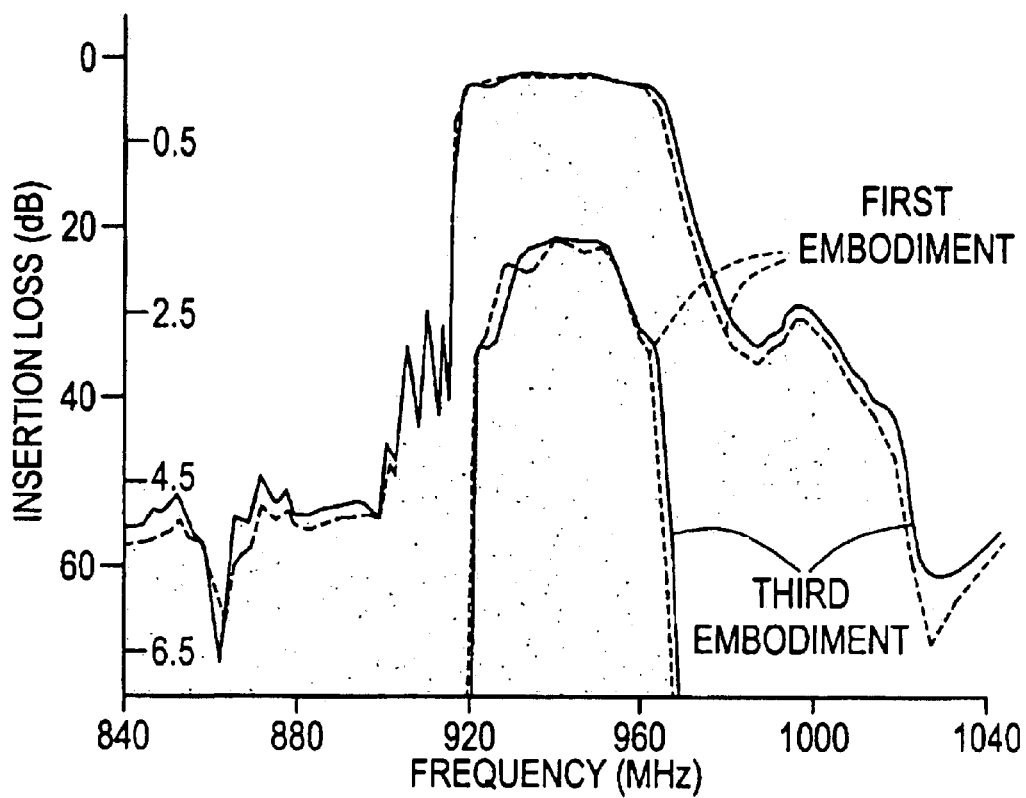
FIGS. 16(a) and 16(b) are graphs indicating the amplitude characteristics and VSWR characteristics of the longitudinally coupled resonator-type surface acoustic wave filters according to the third preferred embodiment and the first preferred embodiment.

That is, the solid lines in FIGS. 16(a) and (b) indicate the amplitude characteristic and the VSWR characteristic of the longitudinally coupled resonator-type surface acoustic wave filter according to the third preferred embodiment. For comparison, the amplitude characteristic and the VSWR characteristic of the longitudinally coupled resonator-type surface acoustic wave filter 11 according to the first preferred embodiment are shown using the dashed lines in FIGS. 16(a) and (b).

Figure 16B:
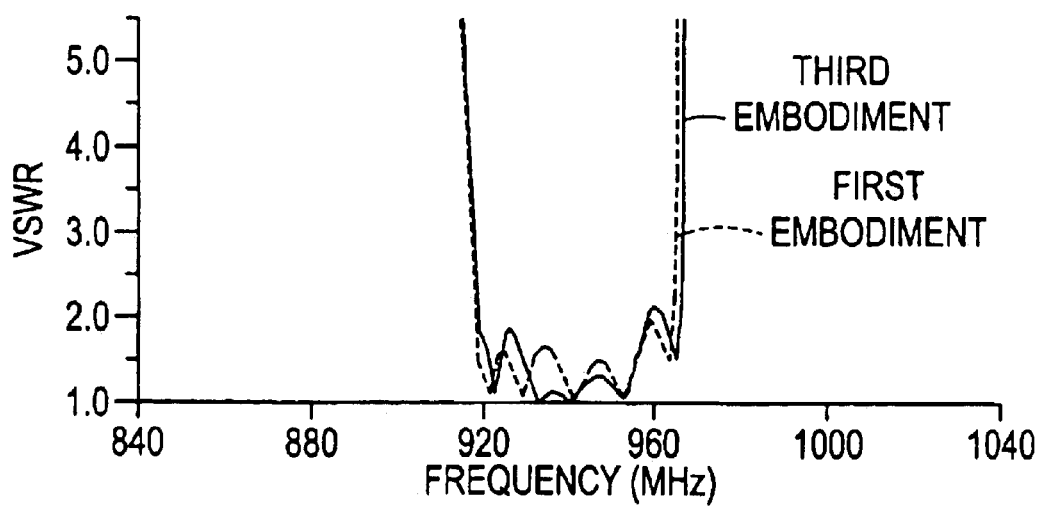

As is obviously indicated in FIG. 16, according to the third preferred embodiment, it is observed compared to the case of the first preferred embodiment that though VSWR is worsened by approximately 0.2, the passband width at 4dB from a through level is widened by approximately 1.5 MHz. In this case, it is found that since the insertion loss level in the passband is hardly changed, a wider band can be realized while the low loss is maintained.

That is, the third preferred embodiment proves that even though VSWR is somewhat worsened, there can be provided the longitudinally coupled resonator-type surface acoustic wave filter which is suitable for an application requiring the reduction in loss in the passband and the expansion of the passband width.

Next, as shown in FIG. 15(a), an example that is effective in a case in which the impedance is capacitive though the impedance concentration ratio is preferable is described.

Figure 17A:
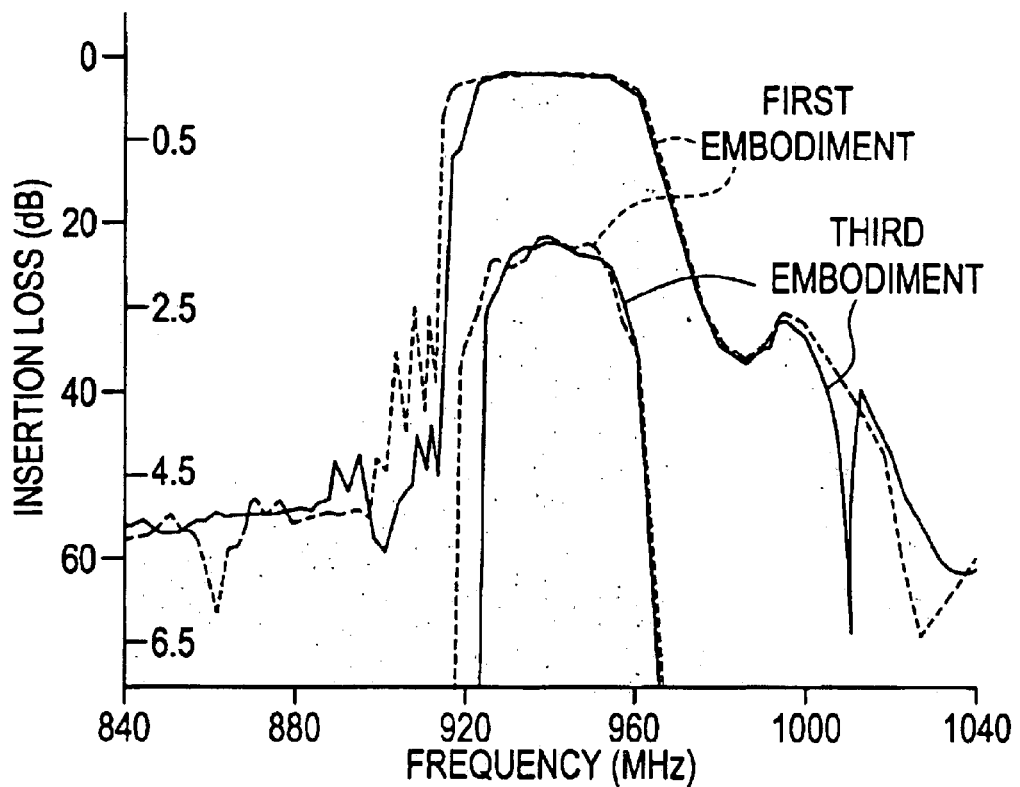
FIGS. 17(a) and 17(b) are graphs indicating the amplitude characteristics and VSWR characteristics of the longitudinally coupled resonator-type surface acoustic wave filter according to the modified example shown in FIG. 15(c).

FIGS. 17(a) and (b) show the amplitude characteristics and the VSWR characteristic of the longitudinally coupled resonator-type surface acoustic wave filter of the above modified example using the solid lines. For comparison, the amplitude characteristics and the VSWR characteristic of the longitudinally coupled resonator-type surface acoustic wave filter according to the first preferred embodiment are shown using the dashed lines. In the modified example which produces the results shown in FIG. 17, the electrode intersecting width is approximately 31.0λI2, the total number of electrode fingers of IDTs 13, 15, 18, and 20 is 28, the number of electrode fingers of the first portion is 3, the number of electrode fingers of the second portion is 25. The total number of electrode fingers of the central IDTs 14 and 19 is 47 in which the numbers of electrode fingers of the first portions on both sides are each 5 and the numbers of electrode fingers of the central second portions are each 37. The wavelength λI1 of the IDT is about 3.88 μm. Otherwise, the modified example is substantially identical to the first preferred embodiment.

Figure 17B:
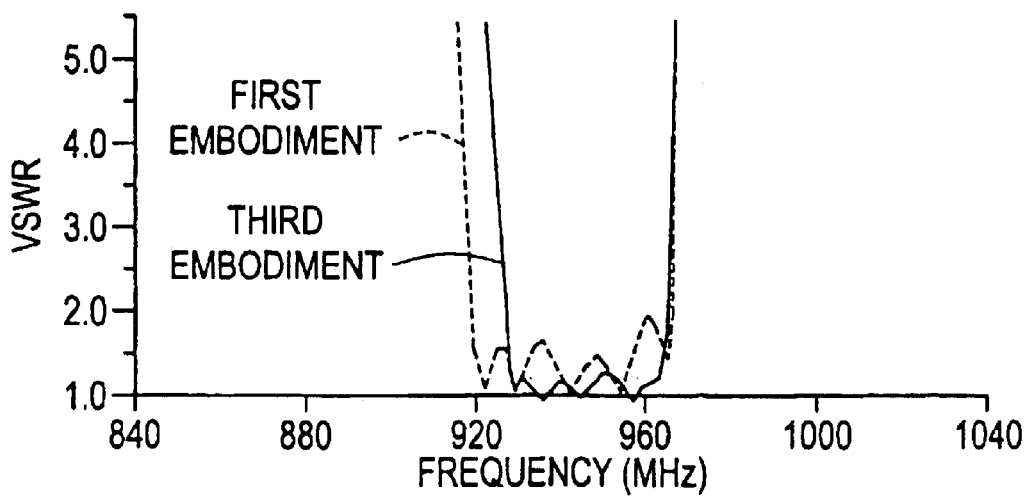

As is obvious from FIG. 17, in the above modified example, compared to the surface acoustic wave filter 11 according to the first preferred embodiment, although the passband width at 4dB from the through level is narrowed by approximately 3.5 MHz while the VSWR is improved by only approximately 0.7. In this case, since insertion loss level is hardly changed in the pass band, VSWR is improved while the low loss is maintained. That is, it is found that, even though the passband width is narrow, the longitudinally coupled resonator-type surface acoustic wave filter which is effective for an application requiring the reduction in loss in the passband as well as the reduction in VSWR can be provided.

As described above, as in the third preferred embodiment, by changing the balance of the electrode fingers of the first portion, in other words, the number of narrow-pitch electrode fingers, the band-pass filter for various applications can be easily provided while the reduction in insertion loss in the passband is achieved.

Figures 18A, 18B:
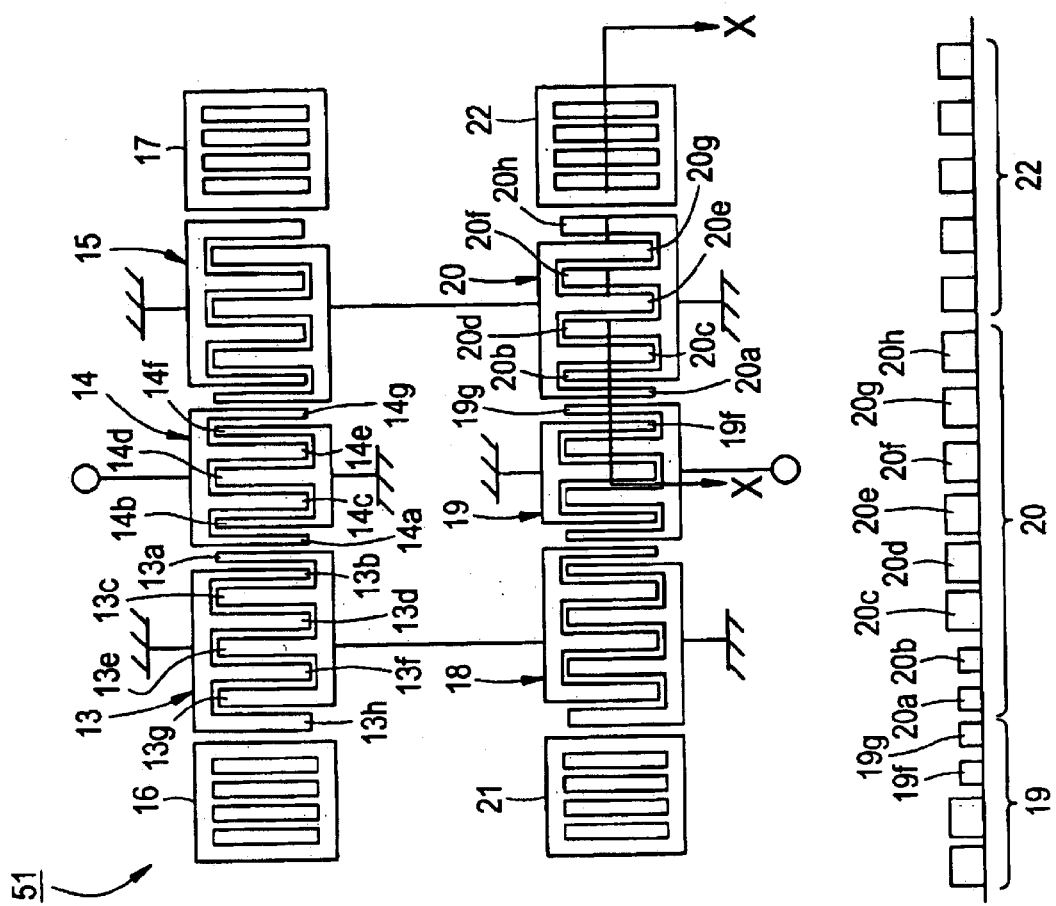
FIGS. 18(a) and 18(b) are a model plan view indicating the electrode construction of a longitudinally coupled resonator-type surface acoustic wave filter according to a fourth preferred embodiment and a substantial cross-sectional view thereof taken along the direction intersecting to the electrode fingers.

FIGS. 18(a) and (b) are a schematic plan view illustrating the longitudinally coupled resonator-type surface acoustic wave filter according to the fourth preferred embodiment and a cross-sectional view taken along the direction intersecting to the electrode fingers. FIG. 18(b) is the schematic cross-sectional view between alternate long and short dashed lines X and X in FIG. 18 (a). The electrode construction shown in FIG. 18(a) is exactly equal to that of the first preferred embodiment shown in FIG. 1.

Therefore, for the equivalent elements, the corresponding reference numerals are assigned. The characteristics of the present preferred embodiment are clearly shown in FIG. 18(b). That is, as shown in a portion provided with IDTs 19 and 20 and the reflector 22 as a typical example, the film thickness of the narrow-pitch electrode fingers is thinner than the film thickness of other electrode fingers or the film thickness of the electrodes of the reflectors. That is, as shown in FIG. 18(b), the film thickness of electrode fingers 19f and 19g of the first portion of the IDT 19 on the IDT 20 side and the film thickness of electrode fingers 20a and 20b of the first portion of the IDT 20 on the IDT 19 side are thinner than the film thickness of other electrode fingers and the film thickness of the electrode of the reflector 22. Likewise, in a portion between the IDTs adjacent to each other shown in FIG. 18(a), the film thickness of the narrow-pitch electrode fingers on both sides of the part is thinner than that of the remaining electrode fingers of the part. To be specific, in the present preferred embodiment, the film thickness of the narrow-pitch electrode fingers is preferably about 0.06λI2 and the film thickness of the remaining electrode fingers is preferably about 0.08λI2.

In the present preferred embodiment, since the film thickness of the narrow-pitch electrode fingers is reduced, the design is altered from the design of the first preferred embodiment so that the electrode finger intersecting width is approximately 38.2λI2 and λI1=3.93 μm. Otherwise, the present preferred embodiment is substantially identical to the first preferred embodiment.

The amplitude characteristics of the longitudinally coupled resonator-type surface acoustic wave filter according to the fourth preferred embodiment are shown using the solid lines in FIG. 19. For comparison, the amplitude characteristics of the longitudinally coupled resonator-type surface acoustic wave filter 11 according to the first preferred embodiment are shown using the dashed lines.

As is obvious from FIG. 19, compared to the first preferred embodiment, the fourth preferred embodiment proves that the insertion loss in the passband is even more improved. Generally, in the surface acoustic wave filter using the leaky wave, by thinning the film thickness of the electrode including Al, there is a tendency to decrease the loss due to radiation of the bulk wave. However, by thinning the electrode film thickness, the electromechanical coupling factor is decreased and the stop-band width of the reflectors is narrowed. This arrangement leads to a problem that the realization of the wider band cannot be achieved.

In the fourth preferred embodiment, to solve this problem, the film thickness of the electrode fingers is thinned in the IDT to IDT spacing in which the radiation of the bulk wave is most likely to occur, in other words, in the portion in which the narrow-pitch electrode fingers are provided. This enables the loss due to the radiation of the bulk wave to be reduced and enables preferable characteristics to be obtained.

Figure 20:
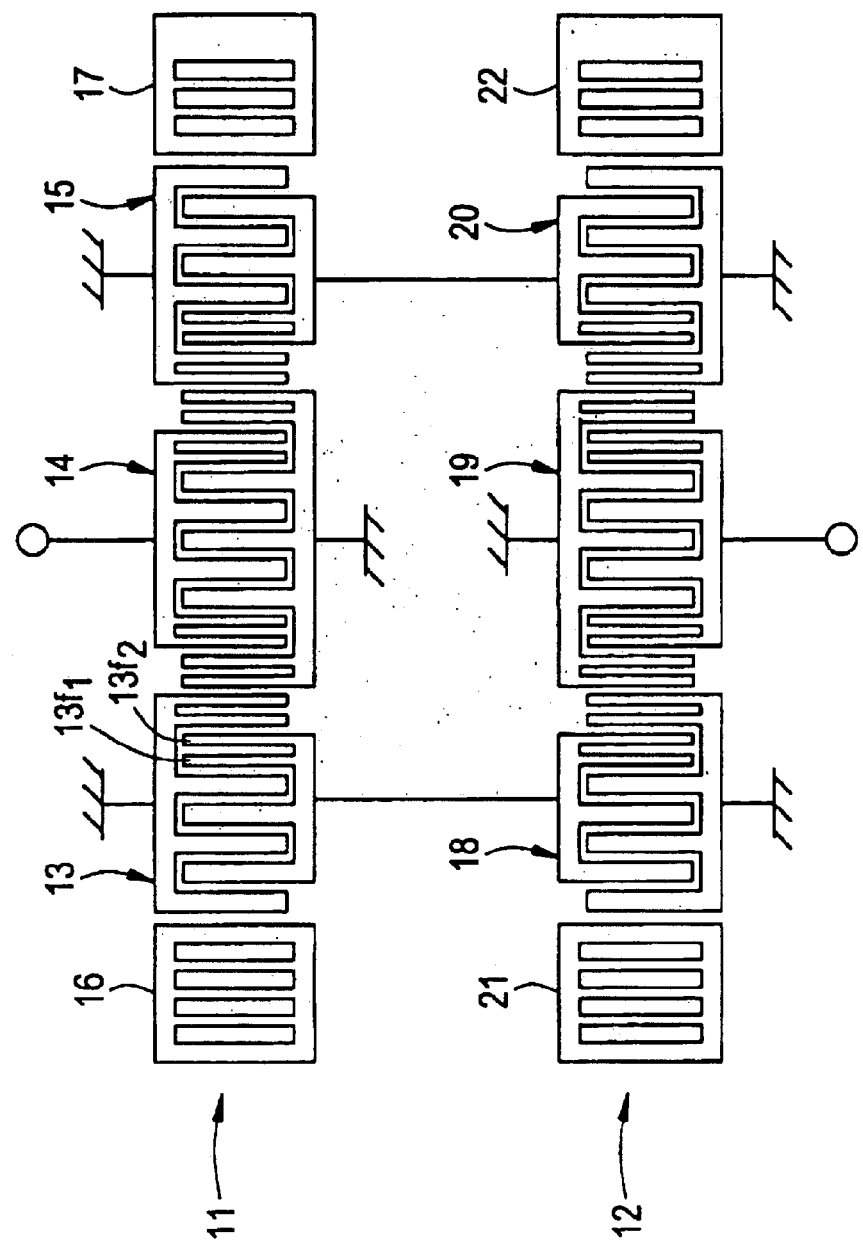
FIG. 20 is a model plan view indicating the electrode construction of a longitudinally coupled resonator-type surface acoustic wave filter according to a fifth preferred embodiment of the present invention.

FIG. 20 is a schematic plan view illustrating the electrode construction of the longitudinally coupled resonator-type surface acoustic wave filter according to the fifth preferred embodiment of the present invention.

A characteristic of the present preferred embodiment is that the narrow-pitch electrode fingers are constructed using a split electrode as typified by split electrode fingers $13f_1$ and $13f_2$. Otherwise, the present preferred embodiment is exactly the same as first preferred embodiment. Only the modified elements are described as follows.

That is, in the fifth preferred embodiment, the electrode finger intersecting width is approximately 35.7λI2, the wavelength λI2 of the IDT is about 4.20 μm, and λI1 is about 4.04 μm.

Figure 21:
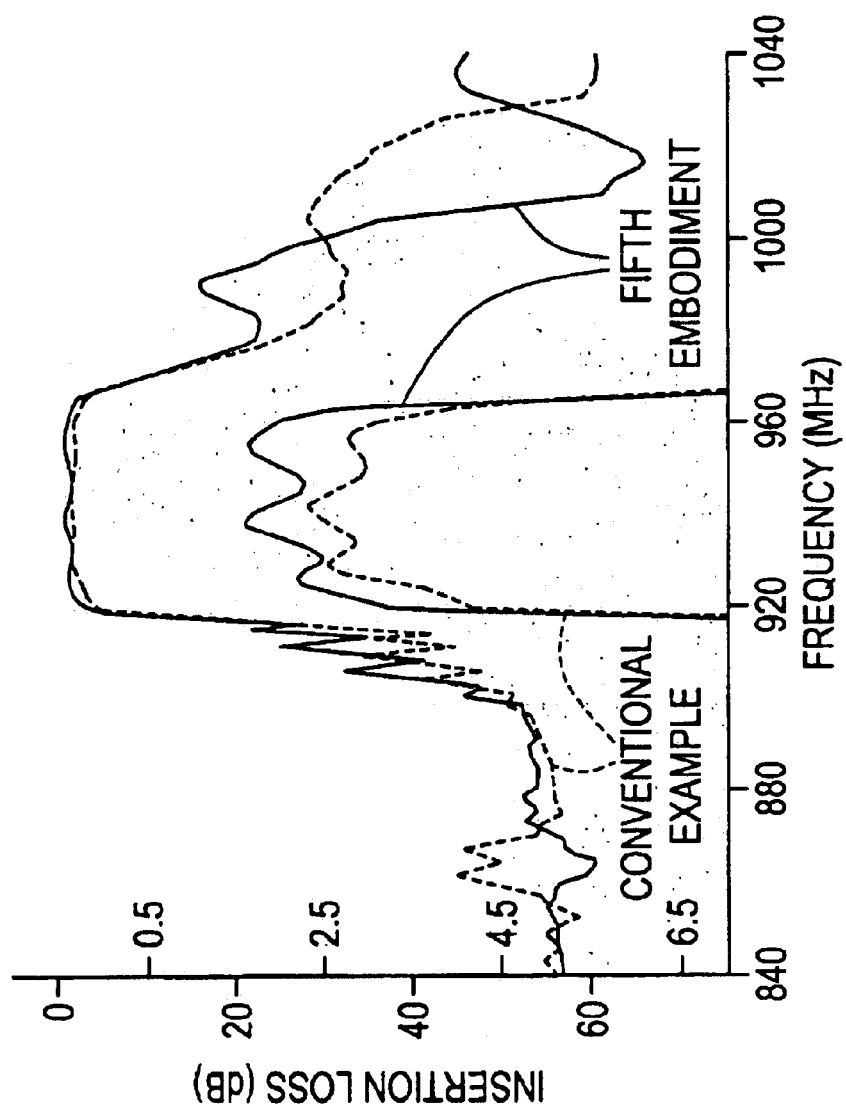
FIG. 21 is a graph indicating the amplitude characteristics of the longitudinally coupled resonator-type surface acoustic wave filter according to the fifth preferred embodiment and the conventional longitudinally coupled resonator-type surface acoustic wave filter.

In FIG. 21, the amplitude characteristics of the longitudinally coupled resonator-type surface acoustic wave filter according to the fifth preferred embodiment are shown using the solid lines. The dashed lines indicate the amplitude characteristics of the conventional longitudinally coupled resonator-type surface acoustic wave filter according to the first preferred embodiment.

As is obviously indicated in FIG. 21, in the fifth preferred embodiment, compared to the conventional longitudinally coupled resonator-type surface acoustic wave filter, the insertion loss in the passband is greatly improved.

Therefore, it is determined that, in various preferred embodiments of the present invention, the narrow-pitch electrode fingers may be constructed using multiple, normally, two split electrode fingers.

The sixth preferred embodiment preferably has exactly the same circuit construction as the first preferred embodiment. Therefore, by applying the descriptions of the first preferred embodiment, the detailed descriptions are omitted.

The sixth preferred embodiment differs from the first preferred embodiment in that the wavelength of the electrode fingers of the first portions of the IDTs 18 to 20 of the surface acoustic wave filter 12, in other words, the wavelength of the narrow-pitch electrode fingers is approximately 3.88 μm. Otherwise, the sixth preferred embodiment is the same as the first preferred embodiment.

That is, in the sixth preferred embodiment, the wavelengths of the narrow-pitch electrode fingers of the longitudinally coupled resonator-type surface acoustic wave filters 11 and 12 which are two-stage vertically connected shown in FIG. 1 are different.

Figure 22:
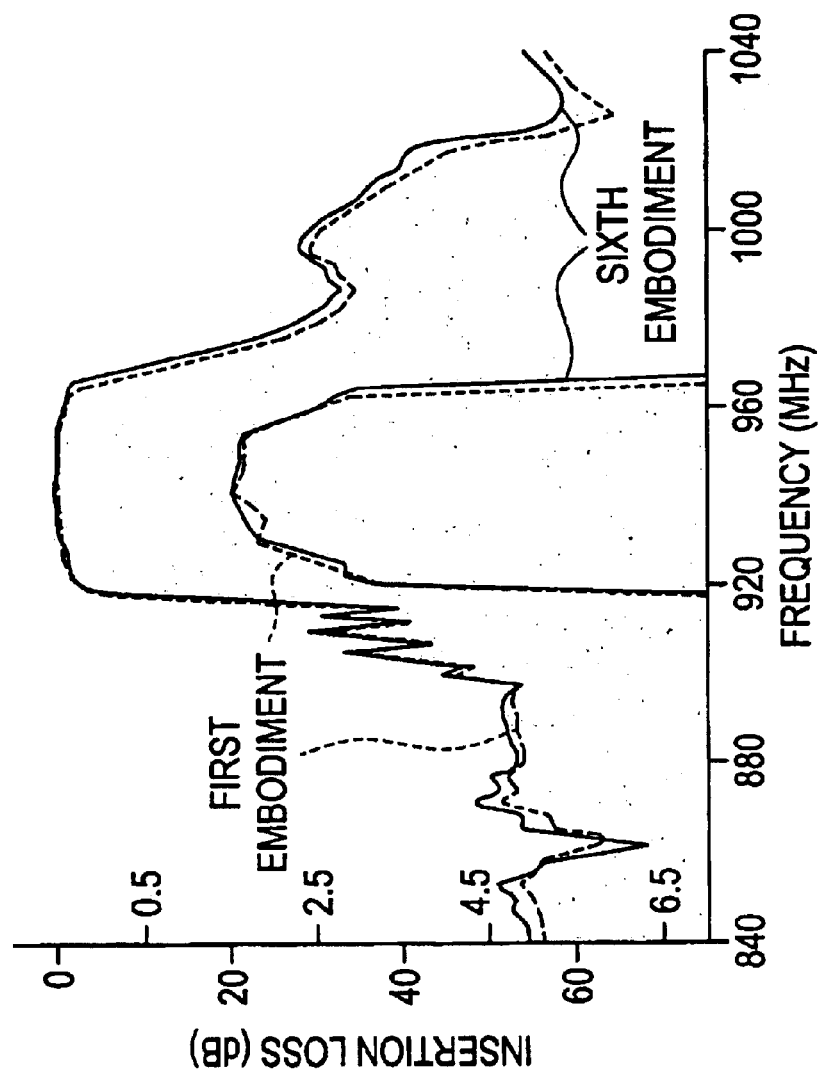
FIG. 22 is a graph indicating the amplitude characteristics of a longitudinally coupled resonator-type surface acoustic wave filter according to the sixth preferred embodiment and the longitudinally coupled resonator-type surface acoustic wave filter according to the first preferred embodiment.

In FIG. 22, the amplitude characteristics of the longitudinally coupled resonator-type surface acoustic wave filter according to the sixth preferred embodiment are shown using the solid lines and the amplitude characteristics of the longitudinally coupled resonator-type surface acoustic wave filter according to the first preferred embodiment are shown using the dashed lines.

As is obviously indicated in FIG. 22, according to the sixth preferred embodiment, the passband width is expanded compared to the first preferred embodiment. In this case, the value of VSWR was approximately 2.0 in both the first and sixth preferred embodiments. Therefore, according to the sixth preferred embodiment, the passband width can be expanded without worsening VSWR.

Thus, when a plurality of surface acoustic wave filters are cascaded, by differentiating among the narrow-pitch electrode finger construction of each stage of the surface acoustic wave filter, in other words, by differentiating the narrow-pitch electrode finger construction of at least one stage of the surface acoustic wave filter from that of the remaining stages of the surface acoustic wave filter, it is proved that the passband width can be widened.

Figure 23:
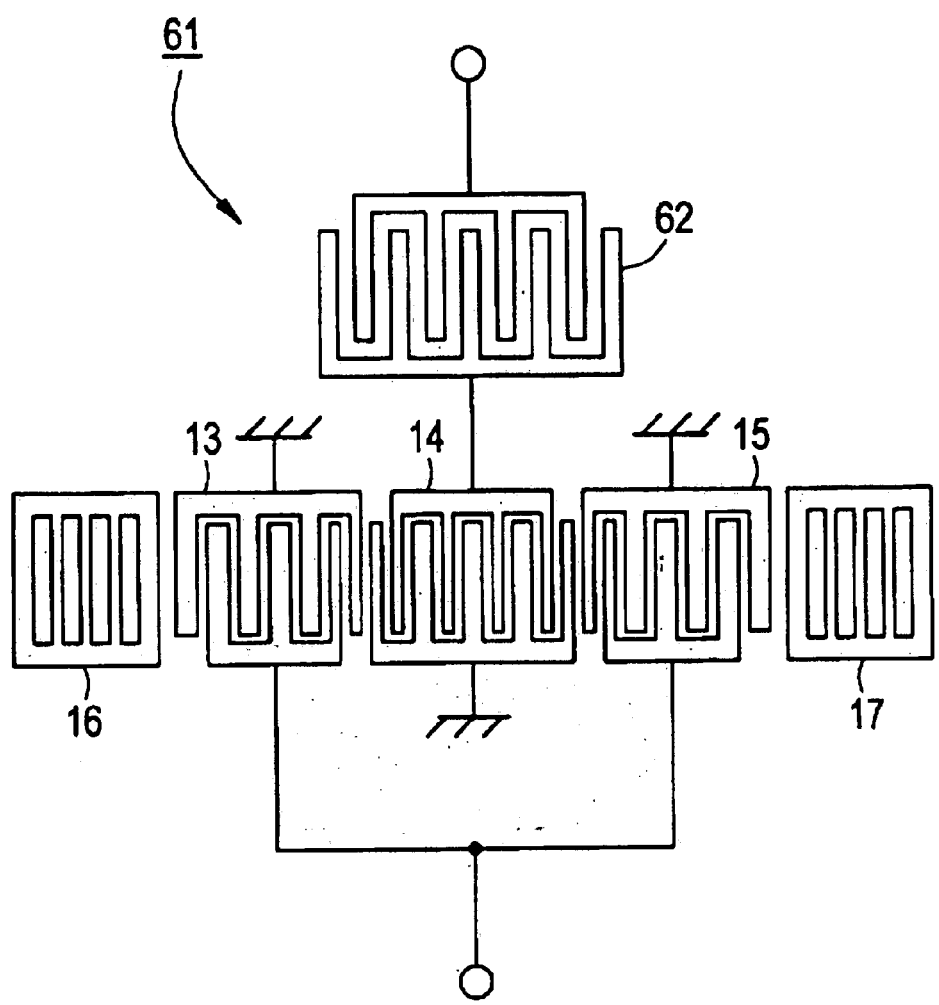
FIG. 23 is a model plan view illustrating the electrode construction of a longitudinally coupled resonator-type surface acoustic wave filter according to a seventh preferred embodiment of the present invention.

FIG. 23 is a schematic plan view illustrating the electrode construction of the longitudinally coupled resonator-type surface acoustic wave filter 61 according to the seventh preferred embodiment of the present invention. The present preferred embodiment corresponds to a modified example of the longitudinally coupled resonator-type surface acoustic wave filter 31 shown in FIG. 9. That is, a surface acoustic wave resonator 62 is connected in series as a series resonator between the central IDT 14 and the input terminal of the one-stage longitudinally coupled resonator-type surface acoustic wave filter 31.

In various preferred embodiments of the present invention, the surface acoustic wave resonator may be connected in series with the longitudinally coupled resonator-type surface acoustic wave filter as shown in the present preferred embodiment.

Conventionally, it is known that, by connecting the surface acoustic wave resonator in series with the longitudinally coupled resonator-type surface acoustic wave filter, the expansion of the out-of-passband attenuation amount can be achieved. However, there is a problem that the insertion loss in the passband increases although the out-of-passband attenuation amount increases.

On the other hand, in the present preferred embodiment, since the above longitudinally coupled resonator-type surface acoustic wave filter constructed according to various preferred embodiments of the present invention is used, the deterioration of the insertion loss decreases. That is, by connecting the surface acoustic wave resonator 62 in series with the longitudinally coupled resonator-type surface acoustic wave filter 31, the out-of-passband attenuation amount can be expanded while the reduction in the insertion loss in the passband is achieved. This enables preferable filtering characteristics to be obtained.

Likewise, in the longitudinally coupled resonator-type surface acoustic wave filter according to various preferred embodiments of the present invention, since the insertion loss in the passband is greatly reduced, the surface acoustic wave resonator may be connected in parallel with the longitudinally coupled resonator-type surface acoustic wave filter constructed according to various preferred embodiments of the present invention. In this case, while the reduction in the insertion loss in the passband is achieved, the expansion of the out-of-passband attenuation amount can be achieved.

Alternatively, the longitudinally coupled resonator-type surface acoustic wave filter may include both the surface acoustic wave resonator connected in series and the surface acoustic wave resonator connected in parallel.

Figure 24:
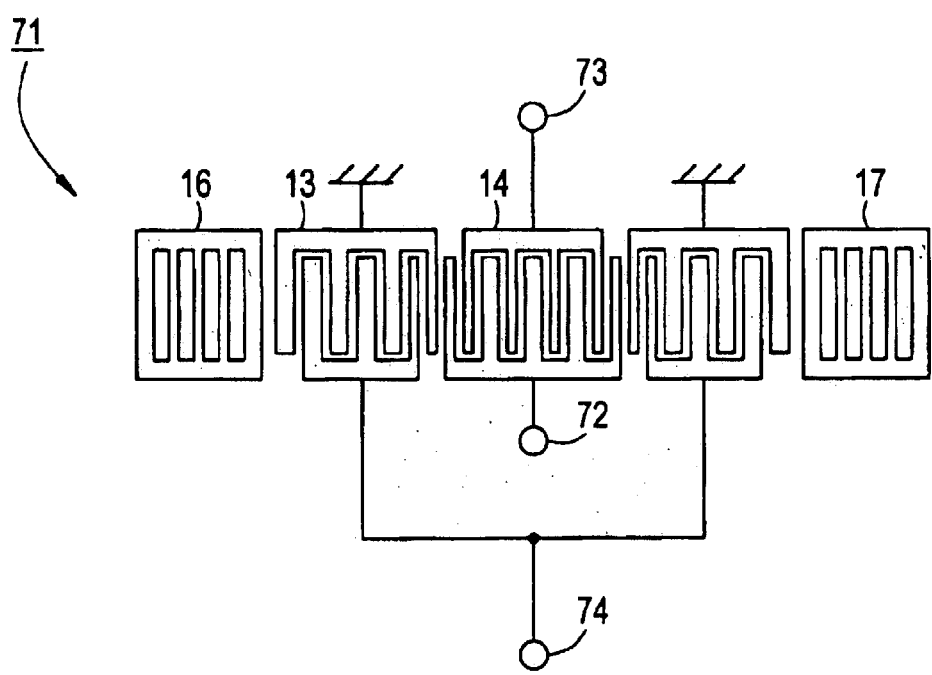
FIG. 24 is a model plan view illustrating the electrode construction of a longitudinally coupled resonator-type surface acoustic wave filter according to an eighth preferred embodiment of the present invention.

FIG. 24 is a schematic plan view illustrating the electrode construction of the longitudinally coupled resonator-type surface acoustic wave filter according to the eighth preferred embodiment. A longitudinally coupled resonator-type surface acoustic wave filter 71 according to the eighth preferred embodiment has the same electrode construction as the longitudinally coupled resonator-type surface acoustic wave filter shown in FIG. 9. They differ in that an unbalanced-input-unbalanced-output is provided in the surface acoustic wave filter shown in FIG. 9 while, in the present preferred embodiment, one terminal of the central IDT is connected to the input terminal and, furthermore, a terminal 72 is provided so that a signal can be obtained from the other terminal of the central IDT.

Recently, longitudinally coupled resonator-type surface acoustic wave filters have been expected to have an balanced-unbalanced transforming function. In the eighth preferred embodiment shown in FIG. 24, by causing a terminal 74 to be the input terminal and causing terminals 72 and 73 to be the output terminals, the unbalanced-input-balanced-output type filter can be constructed. Conversely, by causing the terminals 72 and 73 to be the input terminals and causing the terminal 74 to be the output terminal, the balanced-input-unbalanced-output type filter can be constructed. Therefore, a surface acoustic wave filter having the low insertion loss in the passband as well as the balanced-unbalanced transforming function can be provided. Modified examples of the surface acoustic wave filter having such a balanced-unbalanced transforming function are shown in FIGS. 25 to FIG. 30.

Figure 25:
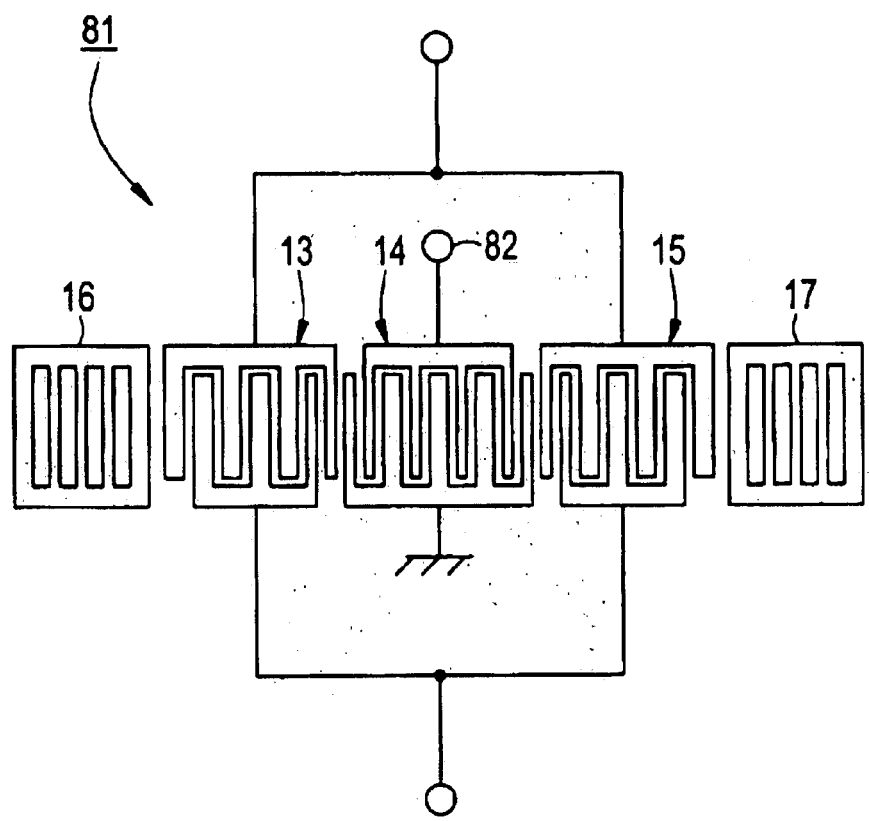
FIG. 25 is a model plan view illustrating a modified example of the longitudinally coupled resonator-type surface acoustic wave filter according to the eighth preferred embodiment.

A longitudinally coupled resonator-type surface acoustic wave filter 81 shown in FIG. 25 is constructed so that the balanced input/output can be obtained from the outer IDTs 13 and 15 and the central IDT 14 is connected to an unbalanced input/output terminal 82.

Figure 26:
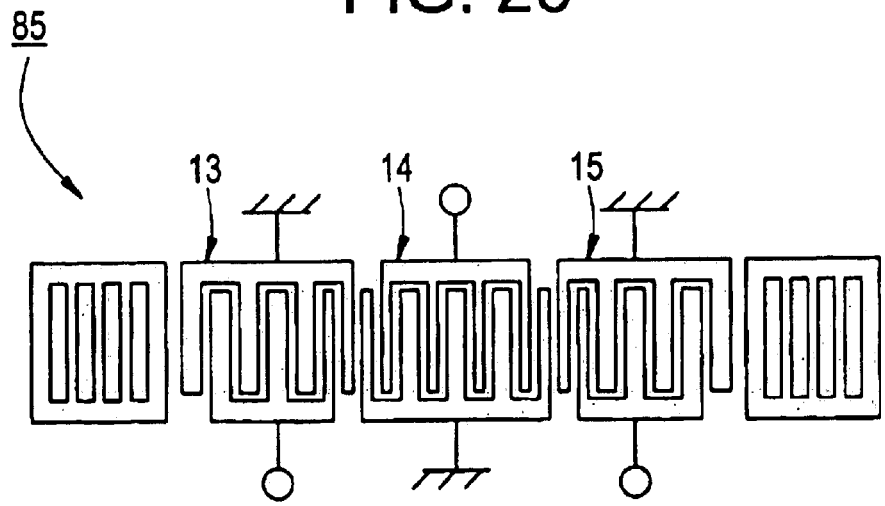
FIG. 26 is a model plan view illustrating another modified example of the longitudinally coupled resonator-type surface acoustic wave filter according to the eighth preferred embodiment.
Figure 27:
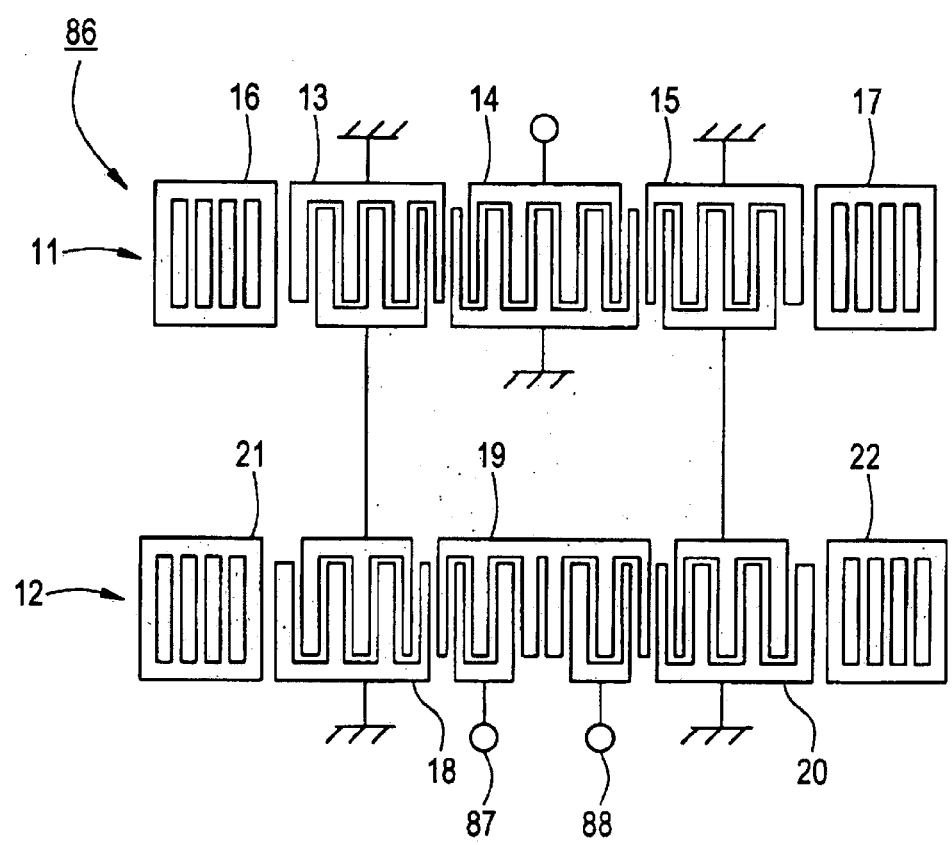
FIG. 27 is a model plan view illustrating still another modified example of the longitudinally coupled resonator-type surface acoustic wave filter according to the eighth preferred embodiment.

In a longitudinally coupled resonator-type surface acoustic wave filter 85 shown in FIG. 26, the phases of the IDTs 13 and 15 to the IDT 14 are reversed whereby the balanced-unbalanced transforming function is realized.

Furthermore, in a longitudinally coupled resonator-type surface acoustic wave filter 86, the phases of the IDTs 18 and 20 of the surface acoustic wave filters 11 and 12 which are two-stage vertically connected are reversed. Terminals 87 and 88 are connected to the IDT 19 so that the balanced signal can be obtained from the IDT 19.

Figure 28:
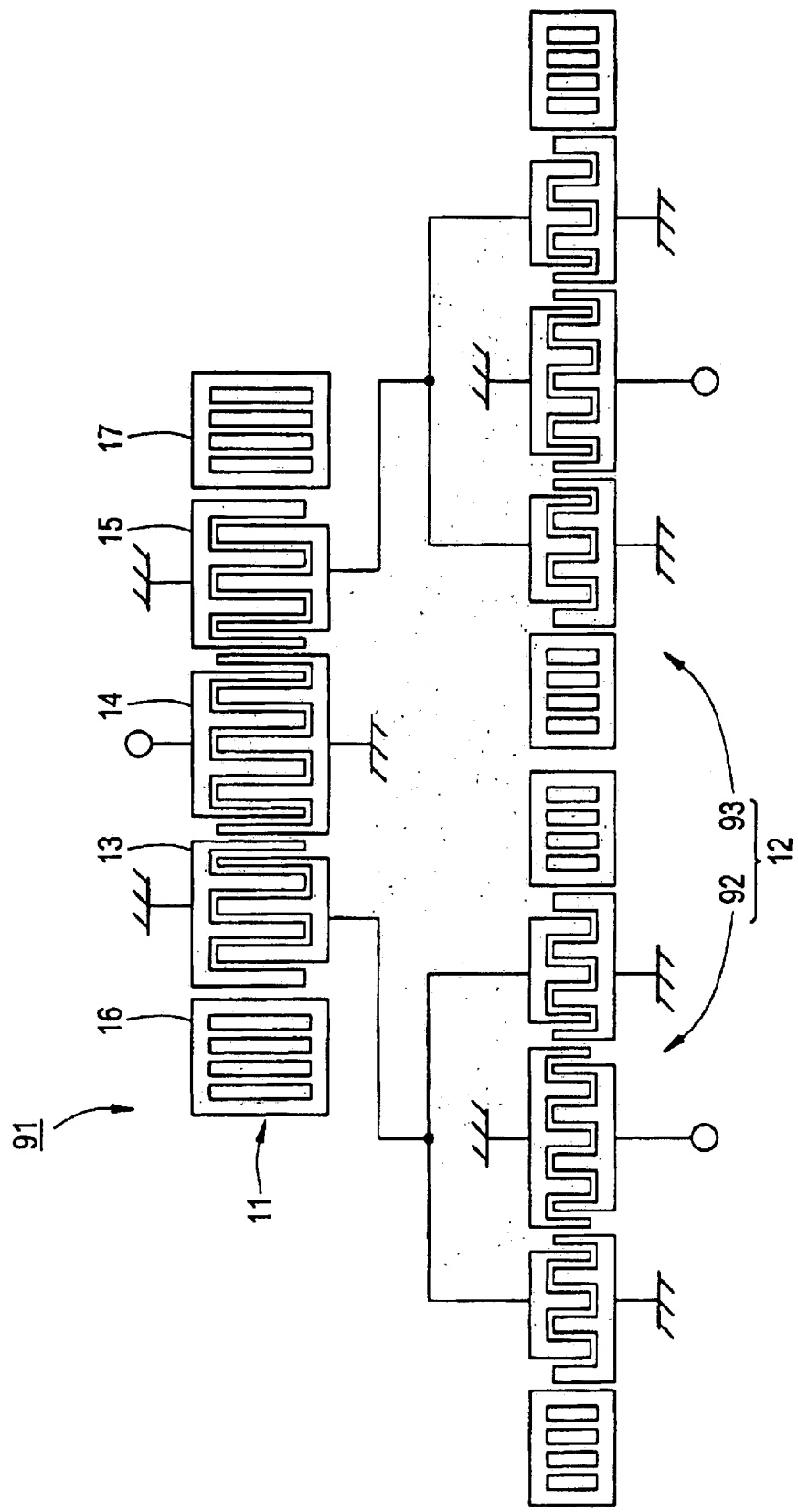
FIG. 28 is a model plan view illustrating another modified example of the longitudinally coupled resonator-type surface acoustic wave filter according to the eighth preferred embodiment.

In the two-stage longitudinally coupled resonator-type surface acoustic wave filters 11 and 12 of a longitudinally coupled resonator-type surface acoustic wave filter 91 shown in FIG. 28, the surface acoustic wave filter 12 which is a side obtaining the balanced terminal is divided into two surface acoustic wave filters 92 and 93 having an intersecting width that is approximately one half the intersecting width of the surface acoustic wave filter 11. In addition, the phases of surface acoustic wave filters 92 and 93 are reversed.

Figure 29:
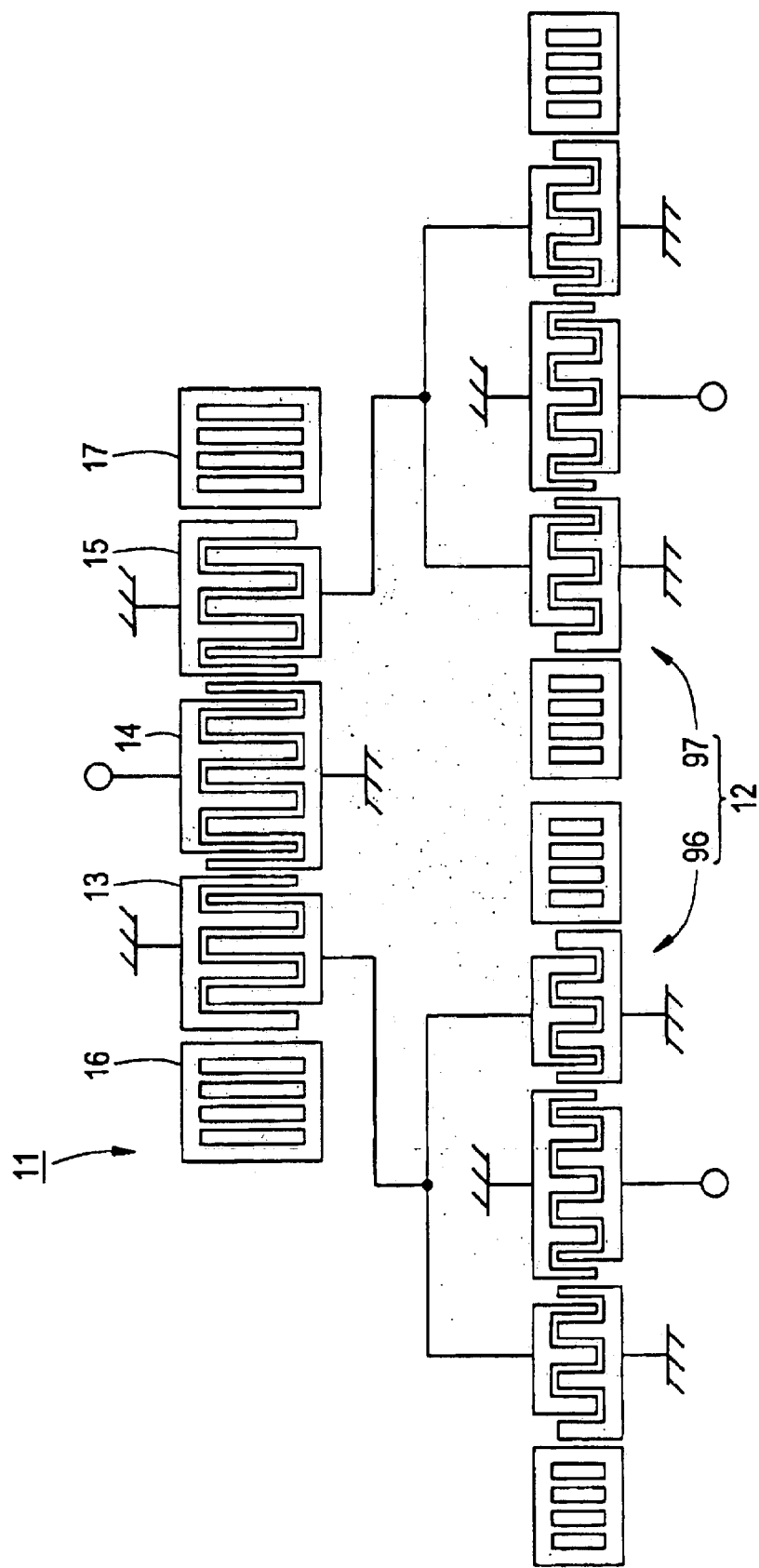
FIG. 29 is a model plan view illustrating still another modified example of the longitudinally coupled resonator-type surface acoustic wave filter according to the eighth preferred embodiment.

Furthermore, as shown in FIG. 29, the balanced-unbalanced transforming function is provided in the construction having the two-stage longitudinally coupled resonator-type surface acoustic wave filters 11 and 12, by dividing the second surface acoustic wave filter 12 into longitudinally coupled resonator-type surface acoustic wave filters 96 and 97 and reversing the phases of the IDTs 13 and 15 with respect to the IDT 14 of the first surface acoustic wave filter 11.

Figure 30:
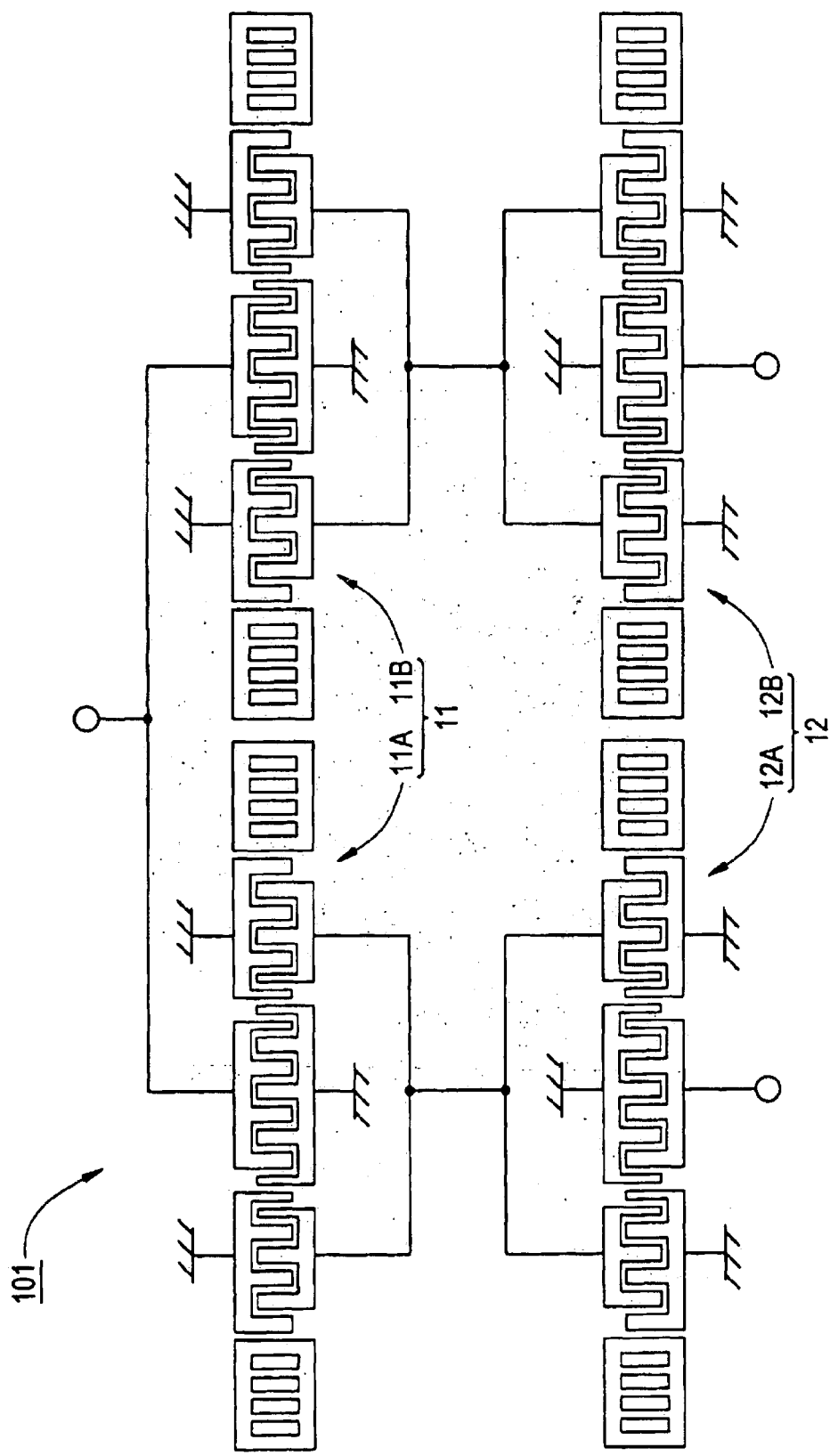
FIG. 30 is a model plan view illustrating still another modified example of the longitudinally coupled resonator-type surface acoustic wave filter according to the eighth preferred embodiment.

In a longitudinally coupled resonator-type surface acoustic wave filter 101 shown in FIG. 30, the two-stage longitudinally coupled resonator-type surface acoustic wave filters are parallel connected in such a manner in which the intersecting width of each of the two-stage longitudinally coupled resonator-type surface acoustic wave filters is reduced into halves. That is, the longitudinally coupled resonator-type surface acoustic wave filters 11 is divided into two longitudinally coupled resonator-type surface acoustic wave filters 11A and 11B and the longitudinally coupled resonator-type surface acoustic wave filter 12 is divided into longitudinally coupled resonator-type surface acoustic wave filters 12A and 12B.

By reversing the phases of one pair of surface acoustic wave filters among these, the balanced-unbalanced transforming function can be provided.

That is, as shown in FIGS. 25 to 30, in the same manner as in the eighth preferred embodiment, there can be provided a surface acoustic wave filter having the balanced-unbalanced transforming function while various constructions reduces the insertion loss.

Figure 31:
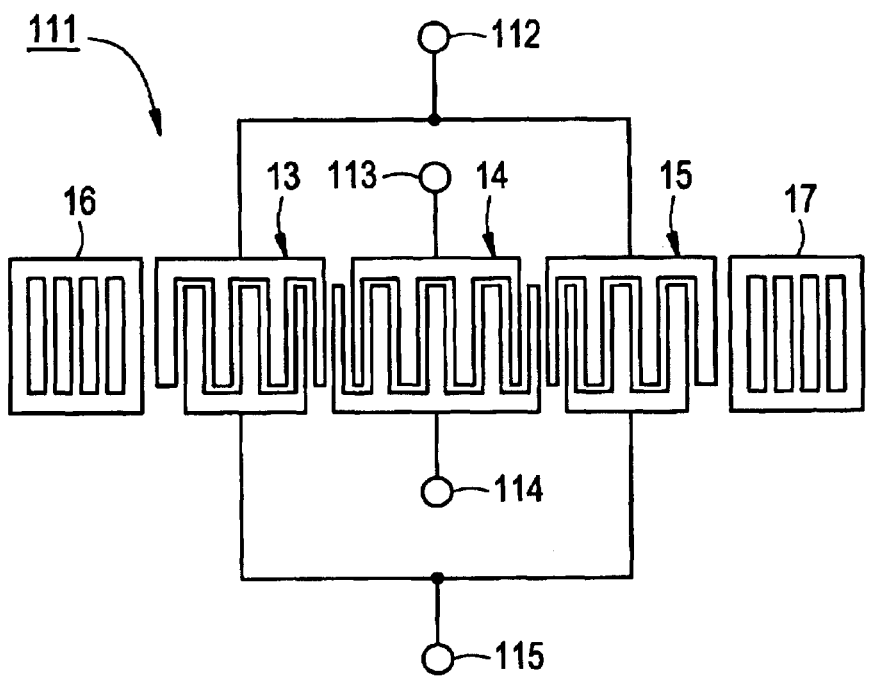
FIG. 31 is a model plan view indicating the electrode construction of a longitudinally coupled resonator-type surface acoustic wave filter according to a ninth preferred embodiment of the present invention.

FIG. 31 is a schematic plan view illustrating the electrode construction of the longitudinally coupled resonator-type wave filter according to the ninth preferred embodiment of the present invention. A longitudinally coupled resonator-type surface acoustic wave filter 111 according to the present preferred embodiment has the same electrode construction as the longitudinally coupled resonator-type surface acoustic wave filter shown in FIG. 8. They differ in that terminals 112 to 115 are provided in order to obtain signals from all of the IDTs 13 to 15.

Here, since the terminals 112 and 115 and terminals 113 and 114 each can obtain balanced signals, a balanced-input-balanced-output surface acoustic wave filter can be obtained. In the present preferred embodiment as well, since the longitudinally coupled resonator-type surface acoustic wave filter is constructed in accordance with preferred embodiments of the present invention, the balanced input/output type surface acoustic wave filter having the low insertion loss in the passband can be provided.

Figure 35:
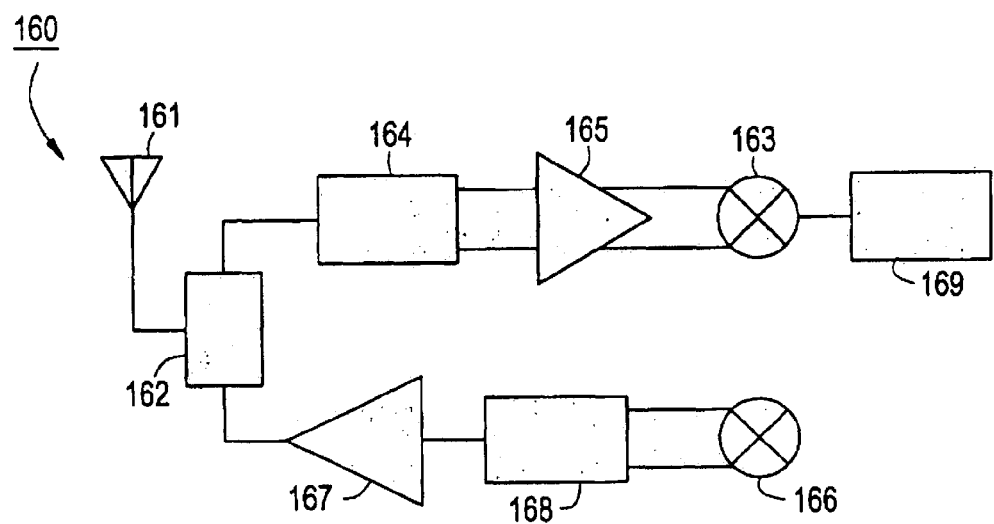
FIG. 35 is a block diagram illustrating a communication apparatus provided with the longitudinally coupled resoator-type surface acoustic wave filter according to a preferred embodiment of the present invention as a band-pass filter.

FIG. 35 is a schematic block diagram illustrating a communication apparatus 160 using the surface acoustic wave device according to another preferred embodiment of the present invention.

In FIG. 35, a duplexer 162 is connected to an antenna 161. A surface acoustic wave filter 164 and an amplifier 165 which constitute an RF stage are connected between the duplexer 164 and the amplifier 165. In addition, an IF stage surface acoustic wave filter 169 is connected to a mixer 163. An amplifier 167 and a surface acoustic wave filter 168 which constitute the RF stage are connected between the duplexer 162 and a mixer 166 on a sending side.

The longitudinally coupled resonator-type surface acoustic wave filter constructed according to preferred embodiments of the present invention can be suitably used as the RF stage surface wave filters 164, 168, and 169 in the above communication apparatus 160.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A longitudinally coupled resonator-type surface acoustic wave filter comprising:
   a piezoelectric substrate; and
   at least three IDTs arranged on said piezoelectric substrate along the propagation direction of the surface acoustic wave, each having a plurality of electrode fingers; wherein
   in at least one of the at least three IDTs, the electrode finger period of a first portion that is adjacent to the side edge of another of the IDTs in the propagation direction of the surface acoustic wave is different from the electrode finger period of a second portion that is the remaining portion of said at least one of the IDTs, the wavelengths of the surface acoustic waves determined by the electrode finger periods of said first portion and said second portion being $\lambda I1$ and $\lambda I2$, respectively; and
   the electrode finger period of said first portion is shorter than the electrode finger period of said second portion.

2. A communication apparatus comprising a longitudinally coupled resonator-type surface acoustic wave filter according to claim 1 defining a band-pass filter.

3. A longitudinally coupled resonator-type surface acoustic wave filter according to claim 1, wherein the electrode finger period of said first portion is about 0.82 to about 0.99 times the electrode finger period of said second portion.

4. A longitudinally coupled resonator-type surface acoustic wave filter according to claim 1, wherein both of a pair of the IDTs which are adjacent to each other are arranged so that the electrode finger period of said first portion is different from the electrode finger period of said second portion, and a center distance between adjacent electrode fingers of said pair of adjacent IDTs is substantially equal to $0.5\lambda I1$.

5. A longitudinally coupled resonator-type surface acoustic wave filter according to claim 1, wherein only one of a pair of the IDTs which are adjacent to each other is arranged so that the electrode finger period of said first portion is different from the electrode finger period of said second portion, and the center distance between adjacent electrode fingers of said pair of adjacent IDTs is substantially equal to $0.25\lambda I1+0.25\lambda I2$.

6. A longitudinally coupled resonator-type surface acoustic wave filter according to claim 1, wherein in the IDT in which the electrode finger period of said first portion is different from the electrode finger period of said second portion, the center distance between the electrode fingers of said first portion and the electrode fingers of said second portion is substantially equal to $0.25\ \lambda I1+0.25\ \lambda I2$ in a portion in which the electrode fingers of said first portion and the electrode fingers of said second portion are adjacent to each other.

7. A longitudinally coupled resonator-type surface acoustic wave filter according to claim 1, wherein the polarity of the electrode fingers adjacent to each other of the IDT Including said first portion and said second portion and the polarity of the electrode fingers of the IDT adjacent to said IDT are different.

8. A longitudinally coupled resonator-type surface acoustic wave filter according to claim 1, wherein the total number of electrode fingers of said first portion is not more than 18 on both sides of the adjacent parts of a pair of the IDTs which are adjacent to each other.

9. A longitudinally coupled resonator-type surface acoustic wave filter according to claim 1, wherein the center distance between the electrode fingers, having periods that are not different, of a pair of the IDTs which are adjacent to each other is $(0.08+0.5n)\lambda I2$ to $(0.24+0.5n)\lambda I2$ ($n=1, 2, 3, \ldots$).

10. A longitudinally coupled resonator-type surface acoustic wave filter according to claim 1, wherein the center distance between the electrode fingers, having periods that are not different, of a pair of the IDTs which are adjacent to each other is $(0.13+0.5n)\lambda I2$ to $(0.23+0.5n)\lambda I2$ ($n=1, 2, 3, \ldots$).

11. A longitudinally coupled resonator-type surface acoustic wave filter according to claim 1, wherein both of a pair of the IDTs, which are adjacent to each other in the propagation direction of the surface acoustic wave filter, include the first portion and the second portion, and the numbers of electrode fingers of the first portions of both IDTs are different.

12. A longitudinally coupled resonator-type surface acoustic wave filter according to claim 1, wherein said piezoelectric substrate is obtained by rotating a LiTaO$_3$ single crystal in the direction of the Y axis in the range of approximately 36 to approximately 44 degrees with respect to the X axis.

13. A longitudinally coupled resonator-type surface acoustic wave filter according to claim 1, wherein the film thickness of the electrode fingers of said first portion is different from the film thickness of the electrode fingers of said second portion.

14. A longitudinally coupled resonator-type surface acoustic wave filter according to claim 13, wherein the film thickness of the electrode fingers of said first portion is thinner than the film thickness of the electrode fingers of said second portion.

15. A longitudinally coupled resonator-type surface acoustic wave filter according to claim 1, wherein the electrode fingers of said first portion include a split electrode.

16. A longitudinally coupled resonator-type surface acoustic wave filter comprising longitudinally coupled resonator-type surface acoustic wave filters according to claim 1 arranged to define at least a two-stage series connection.

17. A longitudinally coupled resonator-type surface acoustic wave filter according to claim 16, wherein the electrode finger period of said first portion of at least one stage of the multiple-stage longitudinally coupled resonator-type surface acoustic wave filter is different from the electrode finger period of said first portion of another stage thereof.

18. A longitudinally coupled resonator-type surface acoustic wave filter according to claim 17, wherein the electrode finger period of said first portion is different in each stage of the multiple-stage longitudinally coupled resonator-type surface acoustic wave filter.

19. A longitudinally coupled resonator-type surface acoustic wave filter according to claim 1, wherein at least one series resonator and/or parallel resonator is connected to an input side and/or output side of the filter.

20. A longitudinally coupled resonator-type surface acoustic wave filter according to claim 1, wherein the filter is constructed so as to have a balanced-unbalanced input/output.

21. A longitudinally coupled resonator-type surface acoustic wave filter according to claim 1, wherein the filter is constructed so as to have a balanced-balanced input/output.

* * * * *